United States Patent
Bower et al.

(10) Patent No.: US 9,929,053 B2
(45) Date of Patent: *Mar. 27, 2018

(54) SYSTEMS AND METHODS FOR CONTROLLING RELEASE OF TRANSFERABLE SEMICONDUCTOR STRUCTURES

(71) Applicant: X-Celeprint Limited, Cork (IE)

(72) Inventors: Christopher Bower, Raleigh, NC (US); Matthew Meitl, Durham, NC (US)

(73) Assignee: X-Celeprint Limited, Cork (IE)

( * ) Notice: Subject to any disclaimer, the term of this patent is extended or adjusted under 35 U.S.C. 154(b) by 0 days.

This patent is subject to a terminal disclaimer.

(21) Appl. No.: 14/947,596

(22) Filed: Nov. 20, 2015

(65) Prior Publication Data

US 2016/0086855 A1    Mar. 24, 2016

Related U.S. Application Data

(63) Continuation-in-part of application No. 14/743,988, filed on Jun. 18, 2015.
(Continued)

(51) Int. Cl.
*H01L 21/78* (2006.01)
*H01L 21/683* (2006.01)
(Continued)

(52) U.S. Cl.
CPC ........ *H01L 21/7806* (2013.01); *B81C 99/008* (2013.01); *H01L 21/561* (2013.01);
(Continued)

(58) Field of Classification Search
CPC .................................................... H01L 27/156
See application file for complete search history.

(56) References Cited

U.S. PATENT DOCUMENTS 5,621,555 A    4/1997 Park
5,815,303 A    9/1998 Berlin
(Continued)

FOREIGN PATENT DOCUMENTS

WO    WO-2008/103931 A2    8/2008
WO    WO-2011/123285 A1    10/2011
WO    WO-2015/193435 A1    12/2015

OTHER PUBLICATIONS

International Search Report, PCT/EP2015/063710, dated Nov. 6, 2015, 3 pages.
(Continued)

*Primary Examiner* — Fernando L Toledo
*Assistant Examiner* — Valerie N Newton
(74) *Attorney, Agent, or Firm* — William R. Haulbrook; Alexander D. Augst; Choate, Hall & Stewart LLP

(57) ABSTRACT

The disclosed technology relates generally to methods and systems for controlling the release of micro devices. Prior to transferring micro devices to a destination substrate, a native substrate is formed with micro devices thereon. The micro devices can be distributed over the native substrate and spatially separated from each other by an anchor structure. The anchors are physically connected/secured to the native substrate. Tethers physically secure each micro device to one or more anchors, thereby suspending the micro device above the native substrate. In certain embodiments, single tether designs are used to control the relaxation of built-in stress in releasable structures on a substrate, such as Si (1 0 0). Single tether designs offer, among other things, the added benefit of easier break upon retrieval from native substrate in micro assembly processes. In certain embodiments, narrow tether designs are used to avoid pinning of the undercut etch front.

16 Claims, 32 Drawing Sheets

Related U.S. Application Data

(60) Provisional application No. 62/245,055, filed on Oct. 22, 2015, provisional application No. 62/029,535, filed on Jul. 27, 2014, provisional application No. 62/014,078, filed on Jun. 18, 2014.

(51) Int. Cl.
*B81C 99/00* (2010.01)
*H01L 21/56* (2006.01)
*H01L 23/00* (2006.01)

(52) U.S. Cl.
CPC ...... *H01L 21/6835* (2013.01); *H01L 21/6836* (2013.01); *H01L 24/83* (2013.01); *H01L 21/568* (2013.01); *H01L 2221/68368* (2013.01)

(56) References Cited

U.S. PATENT DOCUMENTS

| | | | |
|---|---|---|---|
| 5,882,532 A | 3/1999 | Field et al. | |
| 6,278,242 B1 | 8/2001 | Cok et al. | |
| 6,577,367 B2 | 6/2003 | Kim | |
| 6,717,560 B2 | 4/2004 | Cok et al. | |
| 6,756,576 B1 | 6/2004 | McElroy et al. | |
| 6,933,532 B2 | 8/2005 | Arnold et al. | |
| 7,129,457 B2 | 10/2006 | McElroy et al. | |
| 7,195,733 B2 | 3/2007 | Rogers et al. | |
| 7,288,753 B2 | 10/2007 | Cok | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,622,367 B1 | 11/2009 | Nuzzo et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,816,856 B2 | 10/2010 | Cok et al. | |
| 7,893,612 B2 | 2/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,982,296 B2 | 7/2011 | Nuzzo et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,198,621 B2 | 6/2012 | Rogers et al. | |
| 8,207,547 B2 | 6/2012 | Lin | |
| 8,261,660 B2 | 9/2012 | Menard | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,835,940 B2 | 9/2014 | Hu et al. | |
| 8,854,294 B2 | 10/2014 | Sakariya | |
| 8,877,648 B2 | 11/2014 | Bower et al. | |
| 8,889,485 B2 | 11/2014 | Bower | |
| 8,895,406 B2 | 11/2014 | Rogers et al. | |
| 8,987,765 B2 | 3/2015 | Bibl et al. | |
| 9,520,537 B2 | 12/2016 | Bower et al. | |
| 9,601,356 B2 * | 3/2017 | Bower | H01L 21/561 |
| 2003/0141570 A1 | 7/2003 | Chen et al. | |
| 2007/0173034 A1 | 7/2007 | Tsurume et al. | |
| 2008/0108171 A1 | 5/2008 | Rogers et al. | |
| 2010/0248484 A1 | 9/2010 | Bower et al. | |
| 2010/0317132 A1 | 12/2010 | Rogers et al. | |
| 2012/0228669 A1 | 9/2012 | Bower et al. | |
| 2012/0314388 A1 | 12/2012 | Bower et al. | |
| 2013/0069275 A1 | 3/2013 | Menard et al. | |
| 2013/0088416 A1 | 4/2013 | Smith et al. | |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0273695 A1 | 10/2013 | Menard et al. | |
| 2014/0104243 A1 | 4/2014 | Sakariya et al. | |
| 2014/0264763 A1 | 9/2014 | Meitl et al. | |
| 2014/0267683 A1 | 9/2014 | Bibl et al. | |
| 2014/0340900 A1 | 11/2014 | Bathurst et al. | |
| 2014/0367633 A1 | 12/2014 | Bibl et al. | |
| 2015/0028362 A1 | 1/2015 | Chan et al. | |
| 2015/0135525 A1 | 5/2015 | Bower | |
| 2015/0137153 A1 | 5/2015 | Bibl et al. | |
| 2015/0371874 A1 | 12/2015 | Bower et al. | |
| 2016/0093600 A1 | 3/2016 | Bower et al. | |

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

Written Opinion, PCT/EP2015/063710, dated Nov. 6, 2015, 5 pages.

Yaniv et al., A 640 × 480 Pixel Computer Display Using Pin Diodes with Device Redundancy, 1988 International Display Research Conference, IEEE, CH-2678-1/88:152-154 (1988).

Cok, R. S. et al., AMOLED displays with transfer-printed integrated circuits, Journal of the SID, 19(4):335-341 (2011).

\* cited by examiner

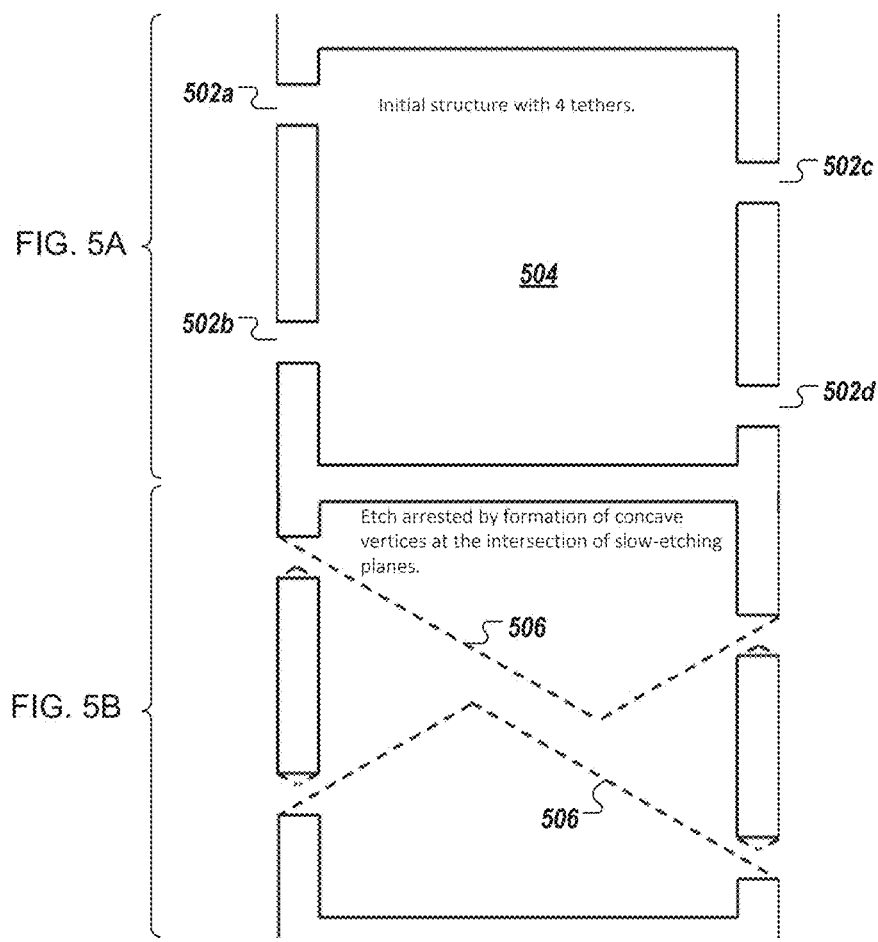

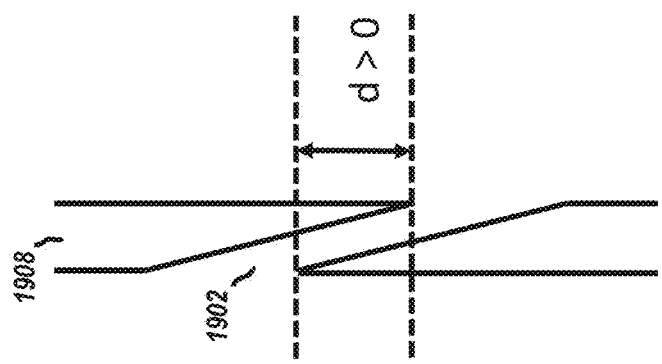

SYSTEMS AND METHODS FOR CONTROLLING RELEASE OF TRANSFERABLE SEMICONDUCTOR STRUCTURES

RELATED APPLICATIONS

This application claims priority to U.S. Provisional Patent Application No. 62/245,055, filed Oct. 22, 2015, titled "Systems and Methods for Controlling Release of Transferable Semiconductor Structures", and this application is a Continuation-in-Part of U.S. patent application Ser. No. 14/743,988, filed Jun. 18, 2015, titled "Systems and Methods for Controlling Release of Transferable Semiconductor Structures," which claims priority to and the benefit of U.S. Provisional Patent Application No. 62/014,078, filed Jun. 18, 2014, titled "Systems and Methods for Controlling Release of Transferable Semiconductor Structures" and U.S. Provisional Patent Application No. 62/029,535, filed Jul. 27, 2014, titled "Systems and Methods for Controlling Release of Transferable Semiconductor Structures," all of which are expressly incorporated by reference herein in their entirety.

FIELD OF THE INVENTION

The disclosed technology relates generally to systems and methods for controlling the release of micro devices using tethers from a native substrate.

BACKGROUND OF THE INVENTION

The disclosed technology relates generally to the formation of transferable micro devices. Semiconductor chip or die automated assembly equipment typically uses vacuum-operated placement heads, such as vacuum grippers or pick-and-place tools, to pick up and apply devices to a substrate. It is often difficult to pick up and place ultra-thin or small micro devices using this technology. Micro transfer printing permits the selection and application of these ultra-thin, fragile, or small micro devices without causing damage to the micro devices themselves.

Micro-structured stamps can be used to pick up micro devices from a native source substrate on which they are formed, transport the micro devices to a non-native destination substrate, and print the micro devices onto the destination substrate. Surface adhesion forces are used to control the selection and printing of these micro devices onto the destination substrate. This process can be performed massively in parallel, transferring hundreds to thousands of discrete structures in a single pick-up and print operation.

Electronically active components can be printed onto the non-native destination substrates. For example, these printing techniques can be used to form imaging devices such as flat-panel liquid crystal, LED, or OLED display devices or in digital radiographic plates. In each instance, the electronically active components are transferred from a native substrate to a destination substrate (e.g., a non-native substrate used to, for example, form an array of the active micro-device components). The active components are picked up from the native substrate and transferred to the destination substrate using an elastomer stamp.

Micro transfer printing enables parallel assembly of high-performance semiconductor micro devices onto virtually any substrate material, including glass, plastics, metals or other semiconductors. The substrates can be transparent or flexible, thereby permitting the production of flexible electronic devices. Flexible substrates can be integrated in a large number of configurations, including configurations not possible with brittle silicon-based electronic devices. Additionally, some plastic substrates, for example, are mechanically rugged and can be used to provide electronic devices that are less susceptible to damage or electronic performance degradation caused by mechanical stress. These materials can be used to fabricate electronic devices by continuous, high-speed, printing techniques capable of distributing electronic devices over large substrate areas at low cost (e.g., roll-to-roll manufacturing). Moreover, these conventional micro transfer-printing techniques can be used to print semiconductor devices at temperatures compatible with assembly on plastic polymer substrates. In addition, semiconductor materials can be printed onto large areas of substrates thereby enabling continuous, high-speed printing of complex integrated electrical circuits over large substrate areas. Moreover, fully flexible electronic devices with good electronic performance in flexed or deformed device orientations can be provided to enable a wide range of flexible electronic devices. However, conventional micro transfer printing techniques lack the reproducibility and precision required to efficiently produce electronics with high-density devices at low cost.

In a conventional micro transfer printing process, prior to transferring micro devices to a destination substrate, a native source substrate is provided with a sacrificial layer having sacrificial material and a plurality of micro devices formed at least in part over the sacrificial layer. The micro devices can be distributed over the native source substrate and spatially separated from each other by an anchor structure. The anchors are physically connected or secured to the native source substrate and tethers physically secure each micro device to one or more anchors.

Anchor structures that remain rigidly attached to the substrate and tether structures that join the releasable micro object to the anchor serve to maintain the spatial configuration of the micro objects upon partial or full separation of the micro object from the bulk substrate. When a transfer stamp picks up the device, the tethers for each device that is picked up are broken. Regarding micro transfer printing, see, for example, U.S. Pat. No. 7,982,296, issued Jul. 19, 2011, the content of which is incorporated herein by reference in its entirety.

However, it has been demonstrated that the release of the active micro-device components is not reliably controlled and not predictable, leading to inefficiencies, irreproducibilities, and errors. Therefore, there is a need for an improved method and system for efficiently and predictably controlling the release of semiconductor structures.

SUMMARY OF THE INVENTION

The disclosed technology relates generally to systems and methods for controlling the release of micro devices using tethers from a native substrate. The disclosed technology provides reliably controlled and predictable release of micro-device components from a substrate, leading to efficiencies, reproducibilities, and less errors during micro-assembly. In certain embodiments, the disclosed technology accomplishes this using a single, off-center tether per micro-device. As described herein, this improves the removal of a sacrificial layer. For example, in some embodiments, this improves the etching of the sacrificial layer such that the desired area under the micro-device is removed in its entirety so that the micro-device can be micro-assembled (e.g., the micro-device can be picked up by a elastomer stamp causing the tether to break).

The disclosed technology relates generally to systems and methods for controlling the release of micro objects (devices) from a native substrate using tethers. In some embodiments, micro objects are designed or configured so that their orientation and spatial configuration are preserved when the micro objects are released from a substrate. Anchor structures that remain rigidly attached to the native substrate and tether structures that join the releasable micro object to the anchor serve to maintain the spatial configuration of the micro objects upon partial or full release of the micro object from the substrate. This can be accomplished by selective removal of a sacrificial layer (e.g., at least partially underneath the micro object) by undercutting, etching, ablation, or other means. In some embodiments, the sacrificial layer is a portion of the native substrate on which the active components are grown. This leaves each micro device supported on and connected to the native substrate by at least one anchor and at least one tether.

In one aspect, the disclosed technology includes an array of micro devices, the array including: a source substrate having a process side; a sacrificial layer comprising silicon (1 0 0) sacrificial material on the process side of the source substrate; a plurality of releasable micro objects formed at least in part on the sacrificial layer; a plurality of anchor structures located on the process side of the source substrate, wherein the anchor structures remain rigidly attached to the source substrate in the absence of the sacrificial material; and a plurality of tethers, wherein each tether of the plurality of tethers connects a releasable micro object of the plurality of releasable micro objects to one of the anchor structures and each releasable micro object is connected to an anchor by a single tether.

In certain embodiments, each of the plurality of tethers is sized and shaped to break when a corresponding micro object is contacted by an elastomer stamp for micro transfer printing from the source substrate to a target substrate, different from the source substrate.

In certain embodiments, the sacrificial material is a portion of the source substrate.

In certain embodiments, the anchor structure forms a continuous structure, spanning more than one releasable micro object of the plurality of releasable micro objects in at least one dimension.

In certain embodiments, the anchor structure comprises a plurality of anchors.

In certain embodiments, each of the plurality of anchors are characterized by locally concave or internal corners and each of the plurality of releasable micro objects is locally characterized by convex or external corners.

In certain embodiments, each of the plurality of tethers is a tether with a width of 10 μm to 40 μm.

In certain embodiments, each of the plurality of tethers is a tether with a narrow shape and a width of 1 μm to 5 μm, 5 μm to 10 μm, 10 μm to 15 μm, 15 μm to 20 μm, or 20 μm to 40 μm.

In certain embodiments, each of the tethers comprises one or more notches that provide a point of fracture when a respective releasable micro object is moved with respect to the anchor structures.

In certain embodiments, the tethers, the printable structure, and the anchors have geometries such that no rectangle with edges parallel to the <0 1 1> directions that has an edge passing through the printable object can be drawn such that all portions of the rectangle are covered by the anchors, tethers, and printable structure.

In another aspect, the disclosed technology includes a method of making thin and low-cost wafer-packaged microscale devices suitable for micro transfer printing using a (1 0 0) Silicon system, the method including: providing a plurality of micro-scale devices; assembling the micro-scale devices onto a carrier wafer using micro-assembly techniques, wherein the carrier wafer comprises Silicon (1 0 0) and a first dielectric layer; embedding the assembled micro-scale devices within a second layer of dielectric; and patterning the first and second dielectric layers to define a perimeter of each of the micro-scale devices with anchors and tethers that preserve the spatial configuration of the micro-scale devices with respect to the carrier wafer when the micro-scale devices are moved with respect to the carrier wafer, thereby providing a wafer-level thin wafer package having micro-scale devices suitable for micro transfer printing to other substrates.

In certain embodiments, forming pad structures on at least one of the top or bottom surfaces of the micro-scale devices, thereby forming a surface-mountable device.

In certain embodiments, the micro scale devices each comprises an integrated circuit interconnected with at least two sensors and an antenna produced using the same wafer-level metallization.

In certain embodiments, the method includes micro transfer printing the micro-scale devices onto a reeled tape; and applying the micro-scale devices to a destination substrate using a tape-fed high-speed chip shooter.

In certain embodiments, the method includes pre-molding the micro-scale devices using a wafer-fed die-attach tool, thereby forming package-on-lead-frames.

In certain embodiments, the method includes forming package-in-package devices of the micro-scale devices using a wafer-fed die-attach tool.

In certain embodiments, the method includes forming wafer-level-packages from the micro-scale devices using a wafer-fed die-attach tool or a wafer-fed micro-transfer printer.

In another aspect, the disclosed technology includes a method of fabricating a printable component array, the method including: forming a sacrificial layer comprising silicon (1 0 0) sacrificial material on a process side of a source substrate; forming a plurality of releasable micro objects at least in part on the sacrificial layer; forming an anchor structure on the source substrate that remains rigidly attached to the source substrate in the absence of the sacrificial material; and forming a plurality of tethers, wherein each tether of the plurality of tethers connects a releasable micro object of the plurality of releasable micro objects to one of the anchor structures, and each tether of the plurality of tethers is located on an off-center, anchor-facing edge of the respective releasable micro object of the plurality of releasable micro objects, and each tether is shaped to fracture in response to movement of the releasable micro object, so that in the absence of the sacrificial material: the releasable micro objects move with respect to the anchor structures; the tethers deform and are mechanically stressed; and each tether of the plurality of tethers remains rigidly attached to both a respective anchor and a respective releasable micro object of the plurality of micro objects, thereby preserving the spatial configuration of the plurality of releasable micro objects with respect to the source substrate; and removing at least a portion of the sacrificial material underneath the plurality of releasable micro objects so that the releasable micro objects move with respect to the anchor structures and the tethers deform and are mechanically stressed.

In certain embodiments, the removal process progresses rapidly under the plurality of releasable micro objects relative to the rate at which the anchor structure is released.

In certain embodiments, each tether of the plurality of tethers has a narrow shape with a width of 10 μm to 40 μm, thereby inhibiting the formation of locally-concave or internal corners.

In certain embodiments, the sacrificial layer has an anisotropic crystal structure for which the removal process progresses faster in some directions and slower in other directions.

In certain embodiments, each tether of the plurality of tethers comprises one or more notches, the notch providing a point of fracture for a releasable micro object when the releasable micro object is moved.

In certain embodiments, the removal process reaches completion at areas near a given tether.

In another aspect, the disclosed technology includes a method of fabricating a plurality of transferable micro objects, the method including: forming a sacrificial layer comprising silicon (1 0 0) sacrificial material on a process side of a source substrate; forming a plurality of releasable micro objects (e.g., printable electronic components, printable active component, micro devices, micro-scale devices) at least in part on the sacrificial layer; applying a polymer layer (e.g., photoresist materials, photodefinable materials) over the plurality of releasable micro objects and at least a portion of the source substrate, wherein the polymer layer encapsulates the plurality of releasable micro objects (e.g., the portion of the plurality of releasable micro objects other than portions in contact with the sacrificial layer); treating the polymer layer to form: (i) a plurality of anchor structures on the source substrate for the plurality of transferable micro objects, (ii) at least one tether between each transferable micro object and a pre-determined anchor structure of the plurality of anchor structures, and (iii) for each of the releasable micro objects, a port of ingress in the polymer layer to a portion of the sacrificial layer underneath a respective transferable micro object; and removing (e.g., by an undercutting etch or ablation) at least a portion of the sacrificial layer underneath the plurality of releasable micro objects.

In certain embodiments, the one or more anchor structures remains rigidly attached to the substrate when the transferable micro object is moved.

In certain embodiments, at least a portion of the sacrificial layer underneath the plurality of releasable micro objects causes each of the plurality of releasable micro objects to move and apply stress on a respective subset of the plurality of tethers.

In certain embodiments, the respective subset of the plurality of tethers comprises a single tether.

In certain embodiments, the method includes transferring the releasable micro objects and removing at least a portion of the polymer from the micro objects.

In certain embodiments, removing at least a portion of the polymer from the micro objects comprises at least one of dissolution, etching, and ashing of the polymer.

In certain embodiments, the method includes transferring the releasable micro objects by contacting at least a portion of a printing stamp to a corresponding portion of the polymer.

In certain embodiments, the tethers, the printable structure, and the anchors have geometries such that no rectangle with edges parallel to the <0 1 1> directions that has an edge passing through the printable object can be drawn such that all portions of the rectangle are covered by the anchors, tethers, and printable structure.

In another aspect, the disclosed technology includes an array of micro devices, the array including: a source substrate having a process side; a sacrificial layer comprising silicon (1 0 0) sacrificial material on the process side of the source substrate; a plurality of releasable micro objects formed at least in part on the sacrificial layer; a plurality of anchor structures located on the process side of the source substrate, wherein the anchor structures remain rigidly attached to the source substrate in the absence of the sacrificial material; and a plurality of tethers, wherein each tether of the plurality of tethers connects a releasable micro object of the plurality of releasable micro objects to one of the anchor structures and each tether of the plurality of tethers is located on an off-center, anchor-facing edge of the respective releasable micro object of the plurality of releasable micro objects, so that in the absence of the sacrificial material the releasable micro objects move with respect to the anchor structures and the tethers deform and are mechanically stressed.

In certain embodiments, each of the plurality of tethers is sized and shaped to break when a corresponding micro object is contacted by an elastomer stamp for micro transfer printing from the source substrate to a target substrate, different from the source substrate.

In certain embodiments, the sacrificial material is a portion of the source substrate.

In certain embodiments, the anchor structure forms a continuous structure, spanning more than one releasable micro object of the plurality of releasable micro objects in at least one dimension.

In certain embodiments, the anchor structure comprises a plurality of anchors.

In certain embodiments, each of the plurality of anchors are characterized by locally concave or internal corners and each of the plurality of releasable micro objects is locally characterized by convex or external corners.

In certain embodiments, each of the plurality of tethers is a tether with a width of 10 μm to 40 μm.

In certain embodiments, each of the plurality of tethers is a tether with a narrow shape and a width of 1 μm to 5 μm, 5 μm to 10 μm, 10 μm to 15 μm, 15 μm to 20 μm, or 20 μm to 40 μm.

In certain embodiments, each of the tethers comprises one or more notches that provide a point of fracture when a respective releasable micro object is moved with respect to the anchor structures.

In certain embodiments, the tethers, the printable structure, and the anchors have geometries such that no rectangle with edges parallel to the <0 1 1> directions that has an edge passing through the printable object can be drawn such that all portions of the rectangle are covered by the anchors, tethers, and printable structure.

In another aspect, the invention is directed to an array of micro devices, the array comprising: a source substrate having a process side; a sacrificial layer comprising sacrificial material on the process side of the source substrate; a plurality of releasable micro objects formed at least in part on the sacrificial layer; a plurality of anchor structures located on the process side of the source substrate, wherein the anchor structures remain rigidly attached to the source substrate in the absence of the sacrificial material; and a plurality of tethers, wherein each tether of the plurality of tethers connects a releasable micro object of the plurality of releasable micro objects to one of the anchor structures and each tether of the plurality of tethers is located on an off-center, anchor-facing edge of the respective releasable micro object of the plurality of releasable micro objects, so that in the absence of the sacrificial material the releasable micro objects move with respect to the anchor structures and the tethers deform and are mechanically stressed.

In certain embodiments, each of the plurality of tethers is sized and shaped to break when a corresponding micro object is contacted by an elastomer stamp for micro transfer printing from the source substrate to a target substrate, different from the source substrate.

In certain embodiments, the sacrificial material is a portion of the source substrate. In certain embodiments, the anchor structure forms a continuous structure, spanning more than one releasable micro object of the plurality of releasable micro objects in at least one dimension. In certain embodiments, the anchor structure comprises a plurality of anchors.

In certain embodiments, each of the plurality of anchors are characterized by locally concave or internal corners and each of the plurality of releasable micro objects is locally characterized by convex or external corners.

In certain embodiments, each of the plurality of tethers is a tether with a width of 10 µm to 40 µm. In certain embodiments, each of the plurality of tethers is a tether with a narrow shape and a width of 1 µm to 5 µm, 5 µm to 10 µm, 10 µm to 15 µm, 15 µm to 20 µm, or 20 µm to 40 µm.

In certain embodiments, the sacrificial layer has an anisotropic crystal structure.

In certain embodiments, the sacrificial layer comprises a material selected from the group consisting of Silicon (1 0 0), InAlP, InP, GaAs, InGaAs, AlGaAs, GaSb, GaAlSb, AlSb, InSb, InGaAlSbAs, InAlSb, and InGaP. In certain embodiments, the sacrificial layer comprises Silicon (1 0 0).

In certain embodiments, each of the tethers comprises one or more notches that provide a point of fracture when a respective releasable micro object is moved with respect to the anchor structures.

In certain embodiments, the source substrate comprises a member selected from the group consisting of Silicon (1 0 0), silicon, indium phosphide, gallium arsenide, and sapphire.

In certain embodiments, each of the tethers has an aspect ratio of greater than 1.

In another aspect, the invention is directed to a method of making thin and low-cost wafer-packaged micro-scale devices suitable for micro transfer printing using a (1 0 0) Silicon system, the method comprising: providing a plurality of micro-scale devices; assembling the micro-scale devices onto a carrier wafer using micro-assembly techniques, wherein the carrier wafer comprises Silicon (1 0 0) and a first dielectric layer; embedding the assembled micro-scale devices within a second layer of dielectric; patterning the first and second dielectric layers to define a perimeter of each of the micro-scale devices with anchors and tethers that preserve the spatial configuration of the micro-scale devices with respect to the carrier wafer when the micro-scale devices are moved with respect to the carrier wafer, thereby providing a wafer-level thin wafer package having micro-scale devices suitable for micro transfer printing to other substrates.

In certain embodiments, the method further comprises: forming pad structures on at least one of the top or bottom surfaces of the micro-scale devices, thereby forming a surface-mountable device.

In certain embodiments, the micro scale devices each comprises an integrated circuit interconnected with at least two sensors and an antenna produced using the same wafer-level metallization. In certain embodiments, the method further comprises: micro transfer printing the micro-scale devices onto a reeled tape; and applying the micro-scale devices to a destination substrate using a tape-fed high-speed chip shooter.

In certain embodiments, the method further comprises: pre-molding the micro-scale devices using a wafer-fed die-attach tool, thereby forming package-on-lead-frames.

In certain embodiments, the method further comprises: forming package-in-package devices of the micro-scale devices using a wafer-fed die-attach tool.

In certain embodiments, the method further comprises: forming wafer-level-packages from the micro-scale devices using a wafer-fed die-attach tool or a wafer-fed micro-transfer printer.

In another aspect, the invention is directed to a method of fabricating a printable component array, the method comprising: forming a sacrificial layer comprising sacrificial material on a process side of a source substrate; forming a plurality of releasable micro objects at least in part on the sacrificial layer; forming an anchor structure on the source substrate that remains rigidly attached to the source substrate in the absence of the sacrificial material; forming a plurality of tethers, wherein each tether of the plurality of tethers connects a releasable micro object of the plurality of releasable micro objects to one of the anchor structures, each tether of the plurality of tethers is located on an off-center, anchor-facing edge of the respective releasable micro object of the plurality of releasable micro objects, and each tether is shaped to fracture in response to movement of the releasable micro object, so that in the absence of the sacrificial material: the releasable micro objects move with respect to the anchor structures; the tethers deform and are mechanically stressed; and each tether of the plurality of tethers remains rigidly attached to both a respective anchor and a respective releasable micro object of the plurality of micro objects, thereby preserving the spatial configuration of the plurality of releasable micro objects with respect to the source substrate; removing at least a portion of the sacrificial material underneath the plurality of releasable micro objects so that the releasable micro objects move with respect to the anchor structures and the tethers deform and are mechanically stressed.

In certain embodiments, the removal process progresses rapidly under the plurality of releasable micro objects relative to the rate at which the anchor structure is released. In certain embodiments, each tether of the plurality of tethers has a narrow shape with a width of 10 µm to 40 µm, thereby inhibiting the formation of locally-concave or internal corners.

In certain embodiments, the sacrificial layer has an anisotropic crystal structure for which the removal process progresses faster in some directions and slower in other directions.

In certain embodiments, each tether of the plurality of tethers comprises one or more notches, the notch providing a point of fracture for a releasable micro object when the releasable micro object is moved.

In certain embodiments, the removal process reaches completion at areas near a given tether.

In certain embodiments, the source substrate is a material selected from the group consisting of Silicon (1 0 0), silicon, indium phosphide, gallium arsenide, and sapphire.

In certain embodiments, each of the plurality of tethers has an aspect ratio of less than 1.

In another aspect, the invention is directed to a method of fabricating a plurality of transferable micro objects, comprising: forming a sacrificial layer comprising sacrificial material on a process side of a source substrate; forming a plurality of releasable micro objects (e.g., printable electronic components, printable active component, micro devices, micro-scale devices) at least in part on the sacrificial layer; applying a polymer layer (e.g., photoresist materials, photodefinable materials) over the plurality of releasable micro objects and at least a portion of the source substrate, wherein the polymer layer encapsulates the plurality of releasable micro objects (e.g., the portion of the plurality of releasable micro objects other than portions in contact with the sacrificial layer); treating the polymer layer to form: (i) a plurality of anchor structures on the source substrate for the plurality of transferable micro objects, (ii) at least one tether between each transferable micro object and a pre-determined anchor structure of the plurality of anchor structures, and (iii) for each of the releasable micro objects, a port of ingress in the polymer layer to a portion of the sacrificial layer underneath a respective transferable micro object; and removing (e.g., by an undercutting etch or ablation) at least a portion of the sacrificial layer underneath the plurality of releasable micro objects.

In certain embodiments, the one or more anchor structures remains rigidly attached to the substrate when the transferable micro object is moved.

In certain embodiments, at least a portion of the sacrificial layer underneath the plurality of releasable micro objects causes each of the plurality of releasable micro objects to move and apply stress on a respective subset of the plurality of tethers.

In certain embodiments, the respective subset of the plurality of tethers comprises a single tether.

In certain embodiments, the method further comprises transferring the releasable micro objects and removing at least a portion of the polymer from the micro objects. In certain embodiments, the method further comprises removing at least a portion of the polymer from the micro objects comprises at least one of dissolution, etching, and ashing of the polymer. In certain embodiments, the method further comprises transferring the releasable micro objects by contacting at least a portion of a printing stamp to a corresponding portion of the polymer.

In certain embodiments, single-tether designs are used to control the relaxation of built-in stress in releasable structures on a substrate, such as Si (1 0 0). Single-tether designs offer, among other things, the added benefit of easier breaking upon removal from a native substrate in micro-assembly processes. In certain embodiments, narrow-tether designs (e.g., tethers with a width of 1 µm to 5 µm, 5 µm to 10 µm, 10 µm to 15 µm, 15 µm to 20 µm, or 20 µm to 40 µm) are used to avoid pinning of an undercutting etch front when etching the sacrificial material from the sacrificial layer.

The disclosed technology, in certain embodiments, includes a method of fabricating a printable component array. The method can include forming a sacrificial layer having sacrificial material on a process side of a source substrate; forming a plurality of releasable micro objects (e.g., printable electronic components, printable active component) at least in part on the sacrificial material; forming an anchor structure on the source substrate that remains rigidly attached to the substrate in the absence of the sacrificial material when the sacrificial material is at least partially removed; performing a removal process (e.g., etch or ablation undercutting the micro objects) to remove at least a portion of the sacrificial material from the sacrificial layer underneath the plurality of releasable micro objects, thereby causing each of the plurality of releasable micro objects to relax and apply mechanical stress on a respective subset (e.g., a single tether) of a plurality of tethers when the micro objects move with respect to the anchor structures so that the tethers deform and are mechanically stressed, for example in response to contact with an elastomer stamp.

In certain embodiments, a single tether of the plurality of tethers physically secures each of the plurality of micro objects to the anchor structure, thereby controlling the relaxation of built-in stress in the plurality of releasable micro objects after the undercut removal process is performed. Each tether of the plurality of tethers can be shaped to fracture responsive to pressure applied thereto (e.g., during transfer/printing). Each tether of the plurality of tethers can remain rigidly attached to both a respective anchor and a respective releasable micro object of the plurality of micro objects, thereby preserving the spatial configuration of remaining micro objects upon transfer of at least a portion of the plurality of micro objects from the source substrate (e.g., via micro transfer printing).

The disclosed technology, in certain embodiments, includes an array of micro objects. The array can include a source substrate; a sacrificial layer on a process side of the source substrate; a plurality of releasable micro objects (e.g., printable electronic components, printable active components) formed at least in part on top of the sacrificial layer material; an anchor structure located on the process side of the source substrate, wherein the anchor structure remains rigidly attached to the substrate when the sacrificial layer is removed, thereby preserving the spatial configuration of the plurality of releasable micro objects with respect to the source substrate; a plurality of tethers, wherein a subset (e.g., a single tether) of the plurality of tethers connects each of the plurality of releasable micro objects to the anchor structure, thereby controlling relaxation of built-in stress in the plurality of releasable micro objects after a removal process removes at least a portion of the sacrificial layer underneath the plurality of releasable micro objects (e.g., an undercutting etch or ablation).

The anchor structure can remain rigidly attached to the substrate when the sacrificial layer is removed by the removal process (e.g., an undercutting etch or ablation), thereby causing the plurality of releasable micro objects to move and apply additional stress on at least a portion of the plurality of tethers, each of which connects one of the plurality of releasable micro objects to the substrate via the anchor structure after the sacrificial material removal is performed.

The disclosed technology, in certain embodiments, includes a method of making transfer-ready integrated circuits using a silicon-on-insulator source wafer with a (1 0 0) handle wafer. The method can include forming a silicon-on-insulator wafer comprising a handle wafer with a (1 0 0) orientation; forming a plurality of transfer-ready integrated circuits on the silicon-on-insulator wafer; patterning the device silicon layer (e.g., thereby physically defining the shape of the integrate circuits); patterning and etching through dielectric layers around the perimeter of each of the transfer-ready integrated circuits, thereby defining a plurality of micro devices; and depositing an inorganic dielectric to passivate the exposed device silicon.

The disclosed technology, in certain embodiments, includes a method of generating thin and low-cost wafer-packaged micro-scale devices suitable for micro transfer printing using a (1 0 0) system. The method can include providing a plurality of micro-scale devices and assembling the micro-scale devices onto a carrier wafer using micro-assembly techniques, wherein the carrier wafer comprises (1

0 0) oriented silicon and a first dielectric layer (e.g., an organic material, for example polyimide, or an inorganic material, for example silicon dioxide); embedding the assembled micro devices within a second layer of dielectric (e.g., an organic material, for example a spin-coated polyimide, or a deposited inorganic material); patterning the first and second dielectric layers, to define a perimeter of the micro-scale devices with anchors and tethers that preserve the spatial configuration of the micro-scale devices with respect to the carrier wafer when the micro-scale devices are moved with respect to the carrier wafer, thereby providing a wafer-level thin wafer package having micro-scale devices suitable for micro transfer printing to other substrates (e.g., using vacuum collets or using a transfer element that physically contacts the devices).

The disclosed technology, in certain embodiments, includes a method of fabricating a plurality of transferable micro objects. The method includes forming a sacrificial layer including sacrificial material on a process side of a source substrate; forming a plurality of releasable micro objects (e.g., printable electronic components, printable active component, micro devices, micro-scale devices) at least in part on the sacrificial layer; applying a polymer layer (e.g., photoresist materials, photodefinable materials) over the plurality of releasable micro objects and at least a portion of the source substrate, wherein the polymer layer encapsulates the plurality of releasable micro objects (e.g., the portion of the plurality of releasable micro objects other than portions in contact with the sacrificial layer); treating the polymer layer to form: (i) a plurality of anchor structures on the source substrate for the plurality of transferable micro objects, the one or more anchor structures remaining rigidly attached to the substrate when the sacrificial layer of the transferable micro object is moved, (ii) at least one tether between each transferable micro object and a pre-determined anchor structure of the plurality of anchor structures, and (iii) for each of the releasable micro objects, a port of ingress in the polymer layer to a portion of the sacrificial layer underneath a respective transferable micro object; and performing a removal process (e.g., an undercutting etch or ablation) to remove at least a portion of the sacrificial layer underneath the plurality of releasable micro objects (e.g., thereby causing each of the plurality of releasable micro objects to move and apply stress on a respective subset (e.g., a single tether) of the plurality of tethers).

The disclosed technology, in certain embodiments, allows for a single polymer layer (e.g., a photoresist or photo-sensitive material) to be employed during the fabrication of the array of micro devices. The single layer (e.g., encapsulation structure) can serve as an anchor structure, a tether structure, or an encapsulation structure or all three. The encapsulation structure, in some embodiments, serves to protect the array of micro devices (including any chemically-sensitive layers thereof) during the device fabrication and micro-printing process and to provide a contact and adhesion interface to the transferring elements employed in the micro-printing process. The encapsulation structure can provide electrical insulation and protection from contaminants, moisture, and oxidizers. The layer can further enable electrical contacts on the bottom, top, or side of a printable object.

In some embodiments, the single polymer layer improves the density of the printable, micro devices for a given wafer. The supporting, non-printable structures (e.g., the anchor and tether) can be fabricated such that distance between adjacent printable structures is small (e.g., less than half the width of the printable structures).

In some embodiments, polymers (e.g., photoresist or photo-sensitive materials) have fracture characteristics that are desirable as a tether, such as sufficient stiffness to maintain the spatial configurations of printable structures during a release process. The polymer that forms the anchoring, tethering, or encapsulation can also be selectively removed from the printable objects and the target substrate after transfer by dissolution, etching, ashing or other processes. In some embodiments, the polymer also has sufficient adhesion to serve as a contact interface with a transfer element of the micro-printing system to be picked up from native substrate and can be treated to serve as an interface for separation between the transfer element and the micro devices once the micro devices have been transferred to a destination substrate. Thus, in an embodiment, the releasable micro objects are transferred by contacting at least a portion of a printing stamp to a corresponding portion of the polymer.

The disclosed technology, in certain embodiments, allows for a dielectric layer (e.g., a silicon dioxide or silicon nitride) to be employed during the fabrication of the array of micro devices. The dielectric layer can serve as an anchor structure, a tether structure, or an encapsulation structure or all three. The encapsulation structure, in some embodiments, serves to protect the array of micro devices (including any chemically-sensitive layers thereof) during the device fabrication and micro-printing process and to provide a contact and adhesion interface to the transferring elements employed in the micro-printing process. The encapsulation structure can provide electrical insulation and protection from contaminants, moisture, and oxidizers. The layer can further enable electrical contacts on the bottom, top, or side of a printable object.

In some embodiments, the dielectric layer improves the density of the printable, micro devices for a given wafer. The supporting, non-printable structures (e.g., the anchor and tether) can be fabricated such that distance between adjacent printable structures is small (e.g., less than half the width of the printable structures).

In some embodiments, dielectric layers have fracture characteristics that are desirable as a tether, such as sufficient stiffness to maintain the spatial configurations of printable structures during a release process. The dielectric that forms the anchoring, tethering, or encapsulation can also be selectively removed from the printable objects and the target substrate after transfer by dissolution, etching, or other processes. In some embodiments, the dielectric layer also has sufficient adhesion to serve as a contact interface with a transfer element of the micro-printing system to be picked up from native substrate and can be treated to serve as an interface for separation between the transfer element and the micro devices once the micro devices have been transferred to a destination substrate. Thus, in an embodiment, the releasable micro objects are transferred by contacting at least a portion of a printing stamp to a corresponding portion of the dielectric material.

In another aspect, the disclosed technology includes an array of micro devices, the array including: a source substrate having a process side; a sacrificial layer comprising sacrificial material on the process side of the source substrate; a plurality of releasable micro objects formed at least in part on the sacrificial layer; a plurality of anchor structures located on the process side of the source substrate, wherein the anchor structures remain rigidly attached to the source substrate in the absence of the sacrificial material; and a plurality of tethers, wherein each tether of the plurality of tethers connects a releasable micro object of the plurality of releasable micro objects to one of the anchor structures and each tether of the plurality of tethers is located on an off-center, anchor-facing edge of the respective releasable micro object of the plurality of releasable micro objects, so that in the absence of the sacrificial material the releasable micro objects move with respect to the anchor structures and the tethers deform and are mechanically stressed.

In certain embodiments, each of the plurality of tethers is sized and shaped to break when a corresponding micro object is contacted by an elastomer stamp for micro transfer printing from the source substrate to a target substrate, different from the source substrate.

In certain embodiments, the sacrificial material is a portion of the source substrate.

In certain embodiments, the anchor structure forms a continuous structure, spanning more than one releasable micro object of the plurality of releasable micro objects in at least one dimension.

In certain embodiments, the anchor structure comprises a plurality of anchors.

In certain embodiments, each of the plurality of anchors are characterized by locally concave or internal corners and each of the plurality of releasable micro objects is locally characterized by convex or external corners.

In certain embodiments, each of the plurality of tethers is a tether with a width of 10 μm to 40 μm.

In certain embodiments, each of the plurality of tethers is a tether with a narrow shape and a width of 1 μm to 5 μm, 5 μm to 10 μm, 10 μm to 15 μm, 15 μm to 20 μm, or 20 μm to 40 μm.

In certain embodiments, the sacrificial layer has an anisotropic crystal structure.

In certain embodiments, the sacrificial layer includes a material selected from the group consisting of Silicon (1 0 0), InAlP, InP, GaAs, InGaAs, AlGaAs, GaSb, GaAlSb, AlSb, InSb, InGaAlSbAs, InAlSb, and InGaP.

In certain embodiments, the sacrificial layer comprises Silicon (1 0 0).

In certain embodiments, each of the tethers comprises one or more notches that provide a point of fracture when a respective releasable micro object is moved with respect to the anchor structures.

In certain embodiments, the source substrate comprises a member selected from the group consisting of Silicon (1 0 0), silicon, indium phosphide, gallium arsenide, and sapphire.

In certain embodiments, each of the tethers has an aspect ratio of greater than 1.

In certain embodiments, the sacrificial layer comprises InAlP.

BRIEF DESCRIPTION OF THE FIGURES

The foregoing and other objects, aspects, features, and advantages of the present disclosure will become more apparent and better understood by referring to the following description taken in conjunction with the accompanying drawings, in which:

FIGS. 5A and 5B are illustrations of an example structure with four tethers per releasable structure;

FIGS. 19 and 20 are illustrations of an example tether design;

The features and advantages of the present disclosure will become more apparent from the detailed description set forth below when taken in conjunction with the drawings, in which like reference characters identify corresponding ele-

DETAILED DESCRIPTION

Figure 1:
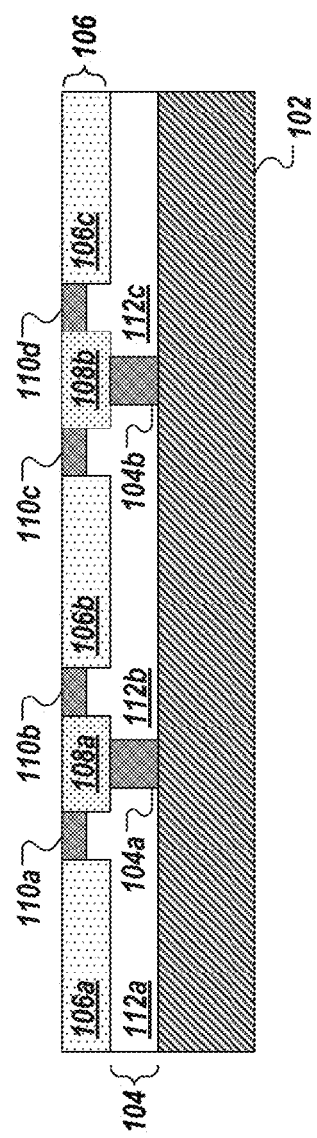
FIG. 1 is an illustration of an example native substrate with micro devices formed thereon.

As used herein the expression "semiconductor element" and "semiconductor structure" are used synonymously and broadly refer to a semiconductor material, structure, device, or component of a device. Semiconductor elements include high-quality single crystalline and polycrystalline semiconductors, semiconductor materials fabricated via high-temperature processing, doped semiconductor materials, organic and inorganic semiconductors, and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light-emitting diodes, lasers, p-n junctions, photodiodes, integrated circuits, and sensors. In addition, semiconductor element can refer to a part or portion that forms a functional semiconductor device or product.

"Semiconductor" refers to any material that is an insulator at a very low temperature, but which has an appreciable electrical conductivity at temperatures of about 300 Kelvin. The electrical characteristics of a semiconductor can be modified by the addition of impurities or dopants and controlled by the use of electrical fields. In the present description, use of the term semiconductor is intended to be consistent with use of this term in the art of microelectronics and electronic devices. Semiconductors useful in the present invention can include elemental semiconductors, such as silicon, germanium and diamond, and compound semiconductors, for example group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light-emitting materials, such as light-emitting diodes (LEDs) and solid-state lasers. Impurities of semiconductor materials are atoms, elements, ions or molecules other than the semiconductor material(s) themselves or any dopants provided in the semiconductor material. Impurities are undesirable materials present in semiconductor materials that can negatively impact the electronic properties of semiconductor materials, and include but are not limited to oxygen, carbon, and metals including heavy metals. Heavy-metal impurities include, but are not limited to, the group of elements between copper and lead on the periodic table, calcium, sodium, and all ions, compounds and/or complexes thereof.

"Substrate" refers to a structure or material on which, or in which, a process is (or has been) conducted, such as patterning, assembly or integration of semiconductor elements. Substrates include, but are not limited to: (i) a structure upon which semiconductor elements are fabricated, deposited, transferred or supported (also referred to as a native substrate); (ii) a device substrate, for example an electronic device substrate; (iii) a donor substrate having elements, such as semiconductor elements, for subsequent transfer, assembly or integration; and (iv) a target substrate for receiving printable structures, such as semiconductor elements. A donor substrate can be, but is not necessarily, a native substrate.

"Destination substrate" as used herein refers to the target substrate (e.g., non-native substrate) for receiving printable structures, such as semiconductor elements. Examples of destination substrate materials include polymer, plastic, resin, polyimide, polyethylene naphthalate, polyethylene terephthalate, metal, metal foil, glass, flexible glass, a semiconductor, and sapphire.

The terms "micro" and "micro-device" as used herein refer to the descriptive size of certain devices or structures in accordance with embodiments of the invention. As used herein, the terms "micro" and "micro-device" are meant to refer to structures or devices on the scale of 0.5 to 250 µm (e.g., from 0.5 to 2 µm, 2 to 5 µm, 5 to 10 µm, 10 to 20 µm, 20 to 50 µm, 20 to 50 µm, 50 to 100 µm, or 100 to 250 µm). However, it is to be appreciated that embodiments of the present invention are not necessarily so limited, and that certain aspects of the embodiments can be applicable to larger or smaller size scales.

"Printable" relates to materials, structures, device components, or integrated functional devices that are capable of transfer, assembly, patterning, organizing, or integrating onto or into substrates without exposure of the substrate to high temperatures (i.e. at temperatures less than or equal to about 400, 200, or 150 degrees Celsius). In one embodiment of the present invention, printable materials, elements, device components, or devices are capable of transfer, assembly, patterning, organizing and/or integrating onto or into substrates via solution printing, micro-transfer printing, or dry transfer contact printing.

"Printable semiconductor elements" of the present invention comprise semiconductor structures that can be assembled or integrated onto substrate surfaces, for example by using dry transfer contact printing, micro-transfer printing, or solution printing methods. In one embodiment, printable semiconductor elements of the present invention are unitary single crystalline, polycrystalline or microcrystalline inorganic semiconductor structures. In the context of this description, a unitary structure is a monolithic element having features that are mechanically connected. Semiconductor elements of the present invention can be undoped or doped, can have a selected spatial distribution of dopants and can be doped with a plurality of different dopant materials, including p- and n-type dopants. The present invention includes microstructured printable semiconductor elements having at least one cross-sectional dimension greater than or equal to about 1 micron and nanostructured printable semiconductor elements having at least one cross-sectional dimension less than or equal to about 1 micron.

Printable semiconductor elements useful in many applications comprise elements derived from "top down" processing of high-purity bulk materials, such as high-purity crystalline semiconductor wafers generated using conventional high-temperature processing techniques. In one embodiment, printable semiconductor elements of the present invention comprise composite structures having a semiconductor operationally connected to at least one additional device component or structure, such as a conducting layer, dielectric layer, electrode, additional semiconductor structure, or any combination of these. In one embodiment, printable semiconductor elements of the present invention comprise stretchable semiconductor elements or heterogeneous semiconductor elements.

The term "flexible" refers to the ability of a material, structure, device or device component to be reversibly deformed into a curved shape, e.g., without undergoing a transformation that introduces significant strain, such as strain characterizing the failure point of a material, structure, device, or device component.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which can provide desired chemical or physical properties. "Dielectric" and "dielectric material" are used synonymously in the present description and refer to a substance that is highly resistant to flow of electric current and can be polarized by an applied electric field. Useful dielectric materials include, but are not limited to, SiO2, Ta2O5, TiO2, ZrO2, Y2O3, SiN4, STO, BST, PLZT, PMN, and PZT.

"Polymer" refers to a molecule comprising a plurality of repeating chemical groups, typically referred to as monomers. Polymers are often characterized by high molecular masses. Polymers useable in the present invention can be organic polymers or inorganic polymers and can be in amorphous, semi-amorphous, crystalline or partially crystalline states. Polymers can comprise monomers having the same chemical composition or can comprise a plurality of monomers having different chemical compositions, such as a copolymer. Cross-linked polymers having linked monomer chains are particularly useful for some applications of the present invention. Polymers useable in the methods, devices and device components of the present invention include, but are not limited to plastics, elastomers, thermoplastic elastomers, elastoplastics, thermostats, thermoplastics and acrylates. Exemplary polymers include, but are not limited to acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Micro-transfer printing" as used herein refers to systems, methods, and techniques for the deterministic assembly of micro- and nano-materials, devices, and semiconductor elements into spatially organized, functional arrangements with two-dimensional and three-dimensional layouts. It is often difficult to pick up and place ultra-thin or small devices; however, micro-transfer printing permits the selection and application of these ultra-thin, fragile, or small devices, such as micro-LEDs, without causing damage to the devices themselves. Microstructured stamps (e.g., elastomeric, electrostatic stamps, or hybrid elastomeric/electrostatic stamps) can be used to pick up micro devices, transport the micro devices to a destination substrate, and print the micro devices onto the destination substrate. In some embodiments, surface adhesion forces are used to control the selection and printing of these devices onto the destination substrate. This process can be performed massively in parallel. The stamps can be designed to transfer a single device or hundreds to thousands of discrete structures in a single pick-up-and-print operation. For a discussion of micro-transfer printing generally, see U.S. Pat. Nos. 7,622,367 and 8,506,867, each of which is hereby incorporated by reference in its entirety.

The disclosed technology relates generally to systems and methods for controlling the release of micro objects (devices) from a native substrate using tethers. In some embodiments, micro objects are designed or configured so that their orientation and spatial configuration are preserved when the micro objects are released from a substrate. Anchor structures that remain rigidly attached to the native substrate and tether structures that join the releasable micro object to the anchor serve to maintain the spatial configuration of the micro objects upon partial or full release of the micro object from the substrate. This can be accomplished by selective removal of a sacrificial layer (e.g., at least partially underneath the micro object) by undercutting, etching, ablation, or other means. In some embodiments, the sacrificial layer is a portion of the native substrate on which the active components are grown. This leaves each micro device supported on and connected to the native substrate by at least one anchor and at least one tether.

In some embodiments, the etching process to remove the sacrificial layer underneath the releasable micro object has a crystallographic dependence, etching faster in some directions of a crystal structure and slower in other directions of the crystal structure. Corner structures etch at different rates because of differences in the number of dangling bonds that are susceptible to different etch rates. For example, in a planar crystal structure, a crystal atom or molecule that is normally connected to four neighbors will only be connected to two neighbors at a convex corner but will be connected to three neighbors at a concave corner. A crystal atom normally connected to eight neighbors will only be connected to three neighbors at a convex corner but will be connected to seven neighbors at a concave corner. Therefore, convex or exterior corners of structures made of the sacrificial layer etch relatively quickly, progressively etching and producing etch fronts parallel to the fast etching planes in the crystal. Concave or internal corners of the structures made of the sacrificial layer have fewer susceptible dangling bonds and etch more slowly, forming a slowly moving or pinned/stopped etch front defined by the slowly etching planes, provided that the resulting etch fronts of the etchants can form and maintain a local shape characterized by the internal/concave corners. Some release layers (also referred to as a sacrificial layer) that exhibit this kind of crystallographic selectivity include Si (1 1 1), Si (1 0 0), InAlP, InP, GaAs, InGaAs, AlGaAs, GaSb, GaAlSb, AlSb, InSb, InGaAlSbAs, InAlSb, and InGaP.

It is often convenient to provide a sacrificial layer that at least temporarily spans the entire area of the first substrate, both in the regions used to form releasable micro objects and in the regions used to form anchoring structures. In those applications, anchoring designs can be used in which the anchor forms a continuous structure, spanning more than one releasable micro object in at least one dimension or designs in which the anchor is positioned about the releasable micro objects. In some embodiments, the anchoring structures are designed with locally concave or internal corners and the releasable micro objects are designed with convex/external corners. In some embodiments, the sacrificial material removal etch progresses rapidly under the releasable micro object (e.g., relative to the rate at which the anchor structure is formed). These designs can be further benefited by tether designs that include fewer locally concave or internal corners, for example, by having a narrow shape that is narrower than the anchor structure to which the tether is attached. In some embodiments, narrow tethers means tethers with a width of 1 µm to 100 µm, 1 µm to 5 µm, 5 µm to 10 µm, 10 µm to 15 µm, 15 µm to 20 µm, or 20 µm to 40 µm. In some embodiments, the width of narrow tethers is 1 µm to 50 µm of 5 µm to 10 µm.

FIG. 1 is an illustration of an example native substrate 102 with micro devices (e.g., 106a, 106b, and 106c) formed in an active layer 106 thereon. The native substrate 102 will vary depending on the type of micro devices formed thereon. Example native substrates include semiconductor materials (e.g., an amorphous, polycrystalline, microcrystalline, or crystalline semiconductor), metal, polymer, or glass. The active layer 106 (including the active components 106a-106c) can include a semiconductor, such as crystalline Si, GaAs, GaN, or a III-V compound semiconductor.

A sacrificial layer 104 is formed on the native substrate 102. Active components 106 can be formed in the active layer 106 formed on the sacrificial layer 104. The active components 106a-106c are distributed over the native substrate 102 and are spatially separated from each other by anchors 108a-108b (collectively anchors 108). The anchors 108 are physically connected or secured to the native substrate 102 by portions of the sacrificial layer 104a, 104b. The active components 106a-106c are suspended above the native substrate 102 by tethers 110a-110d (collectively tethers 110) that physically secure each active component 106a-106d to one or more anchors 108. In some embodiments, a single anchor or tether (not shown) is used to secure each active component 106a-106c to the substrate 102. The tethers 110 and anchors 108 can be at least in part electrically conductive thereby electrically connecting each active component 106a-106c to one or more tethers 110 or anchors 108. In some embodiments, electrically functional anchors 108 include passive electrical elements such as electrical conductors, resistors, capacitors, or contact pads, or active components such as transistors and capacitors.

The anchors 108 are connected to the substrate layer 102 by the sacrificial layer 104 beneath the electrically functional anchors 108. The sacrificial layer 104, in some embodiments, is absent in the areas 112a-112c (collectively 112) below the active components 106a-106d, thereby isolating the active components 106a-106d from the anchors 108. In some embodiments, the sacrificial layer 104 is absent in areas 112 below the active components 106a-106d after an etching process has been performed to remove the sacrificial layer 104 from those areas. For example, in some embodiments, transferable semiconductor structures are grown on a native substrate material, such as Si (1 0 0). The structures can be released by undercut etching the substrate materials or a sacrificial material formed between the native substrate material and the transferable semiconductor structures.

In some embodiments, the tethers 110 or anchors 108 are heterogeneous such that they are made of a material other than the base substrate material (e.g., a material other than the semiconductor material that forms the native substrate). For example, the tethers 110 or anchors 108 can be crystalline, polycrystalline, amorphous, or ductile.

The sacrificial layer 104 can be an oxide, such as silicon dioxide. The tethers 110 can include metal, semiconductors, or doped semiconductors, and/or metal layers thereby providing electrical conductivity between the anchors 108 and the printable active components 106a-106d. The tethers 110 or anchors 108 can include non-conductive dielectrics or resins.

Figure 2:
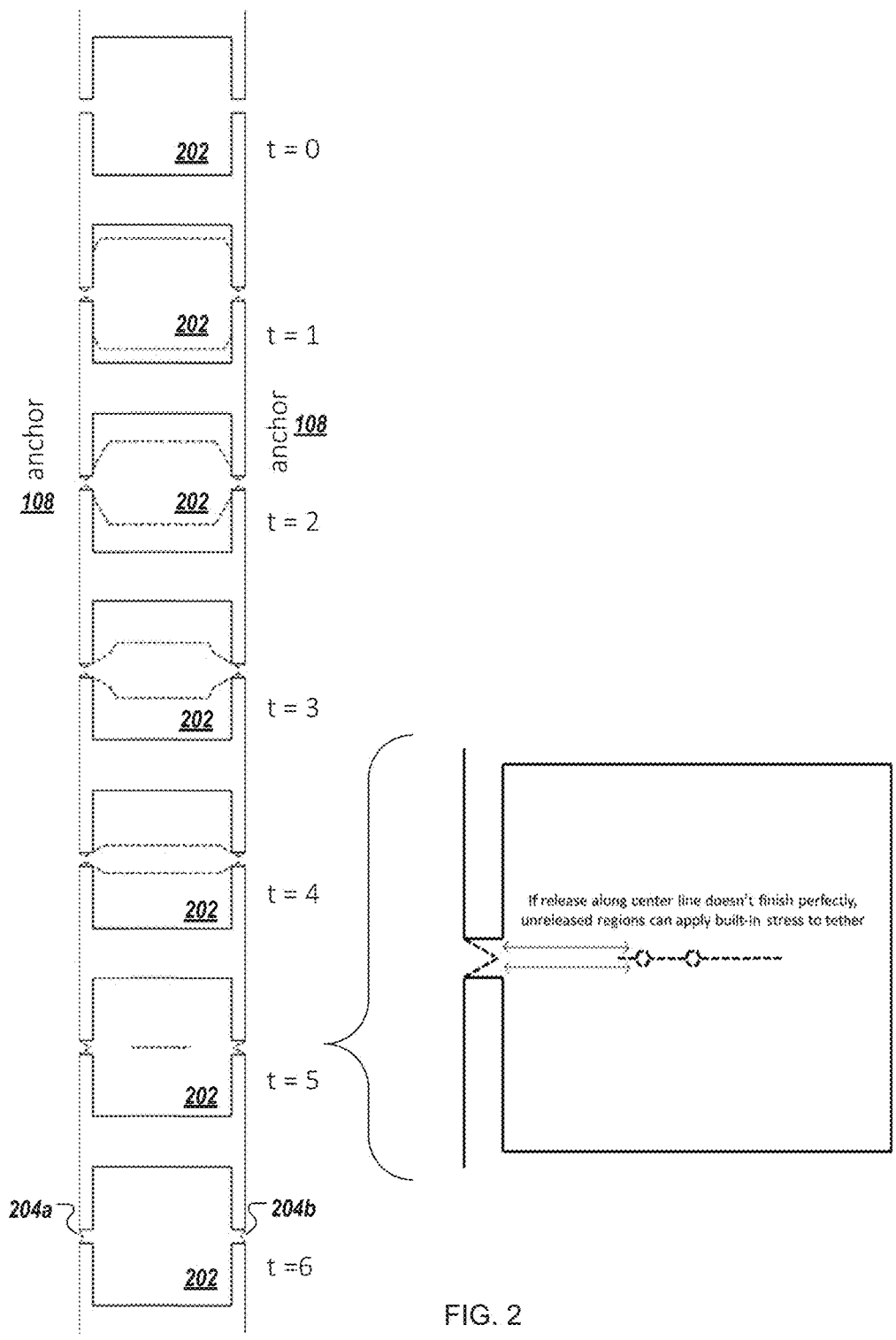
FIG. 2 is an illustration of the process of undercut etching over time.

FIG. 2 illustrates the process of undercut etching the sacrificial layer over time. The dotted lines in FIG. 2 indicate the extent of the etchant beneath the semiconductor device 202 (corresponding to the active components 106a-106d). The semiconductor device 202 is shown at t=0 before the etching process to release the semiconductor structure 202 has begun. In some embodiments, anchor structures 108 are formed perpendicular to the (1 2 2) family of directions of crystalline silicon 111. In some embodiments, the anchor structures 108 form structures that are at least twice as wide as the device 202 to be released. The anchor structures 108, in some embodiments, encircle the device 202 structure to be released so that the anchor structures 108 are not released by the undercut etch. In some embodiments, orientation of the sacrificial layer 104 is selected to allow the undercut etch progression to occur according to FIG. 2, as shown from t=0 to t=6 with a vertical fast-etch direction corresponding to the progression of the dotted-line etch front under the device 202. In some embodiments, the sacrificial layer 104 is of sufficient thickness to allow the etchant to flow within the sacrificial layer 104 once the sacrificial material is removed.

In some embodiments, the device 202 structure to be released holds residual stress, for example due to epitaxial growth of active materials (e.g. active layer 106) or buffers. Upon release by undercut etching, the device 202 structure can partially or fully relax, deform, or move and therefore apply additional stress on the portions of the structure still attached to the substrate (e.g., the tethers 204 corresponding to the tethers 110 of FIG. 1). In some embodiments, if the stress applied to the tethers 204 is great enough to fracture the tethers 204, then the device 202 structure can be prematurely lost in the release chemistry before the micro devices 202 are employed in the micro-printing process (e.g., picked up by a conformable transfer element).

Figure 3:
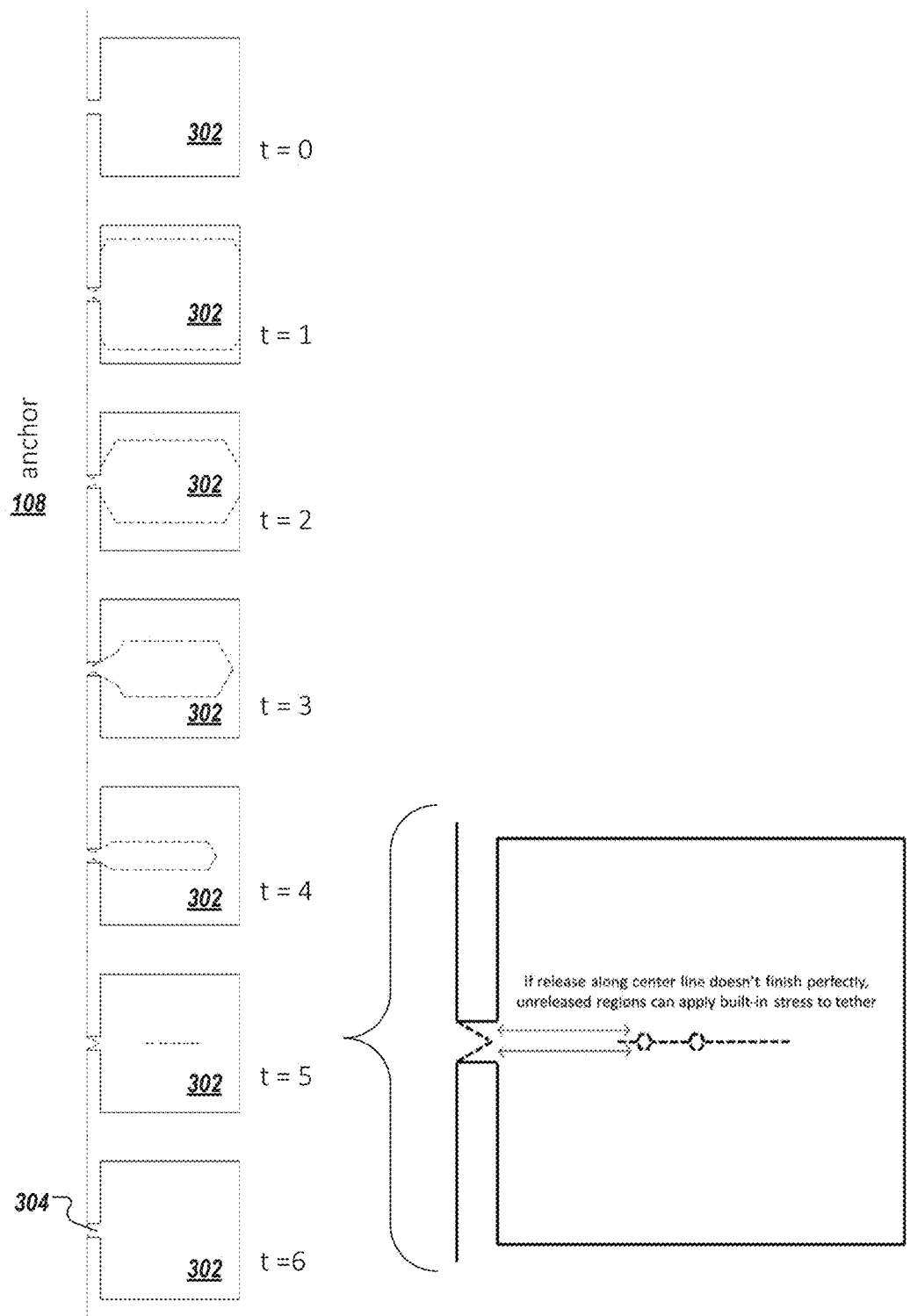
FIG. 3 is an illustration of the process of undercut etching a transferable semiconductor with a single tether.

FIG. 3 is an illustration of the process of undercut etching a transferable semiconductor 302 (corresponding to the active components 106a-106d) with a single tether 304 (corresponding to a tether 110 of FIG. 1). Undercut etch progression beneath the semiconductor devices 302 occurs according to the progression shown in FIG. 3 with the dotted lines. In some embodiments, the device 302 structure to be released holds residual stress, for example, due to epitaxial growth of active materials (e.g. active layer 106) or buffers. Upon release by undercut etching, the device 302 structure can partially or fully relax, deform, or move, and therefore apply additional stress on the portions of the structure still attached to the substrate (e.g., tether 304 corresponding to the tethers 110 of FIG. 1). If the device 302 structure is held by a single tether 304 located at the center point of an anchor-facing edge device 302 structure, the undercut completes along a line at the center of the structure, and free expansion or contraction of the non-tethered edge can accommodate the deformation that occurs upon release without applying stress to the tether 304.

Figure 4:
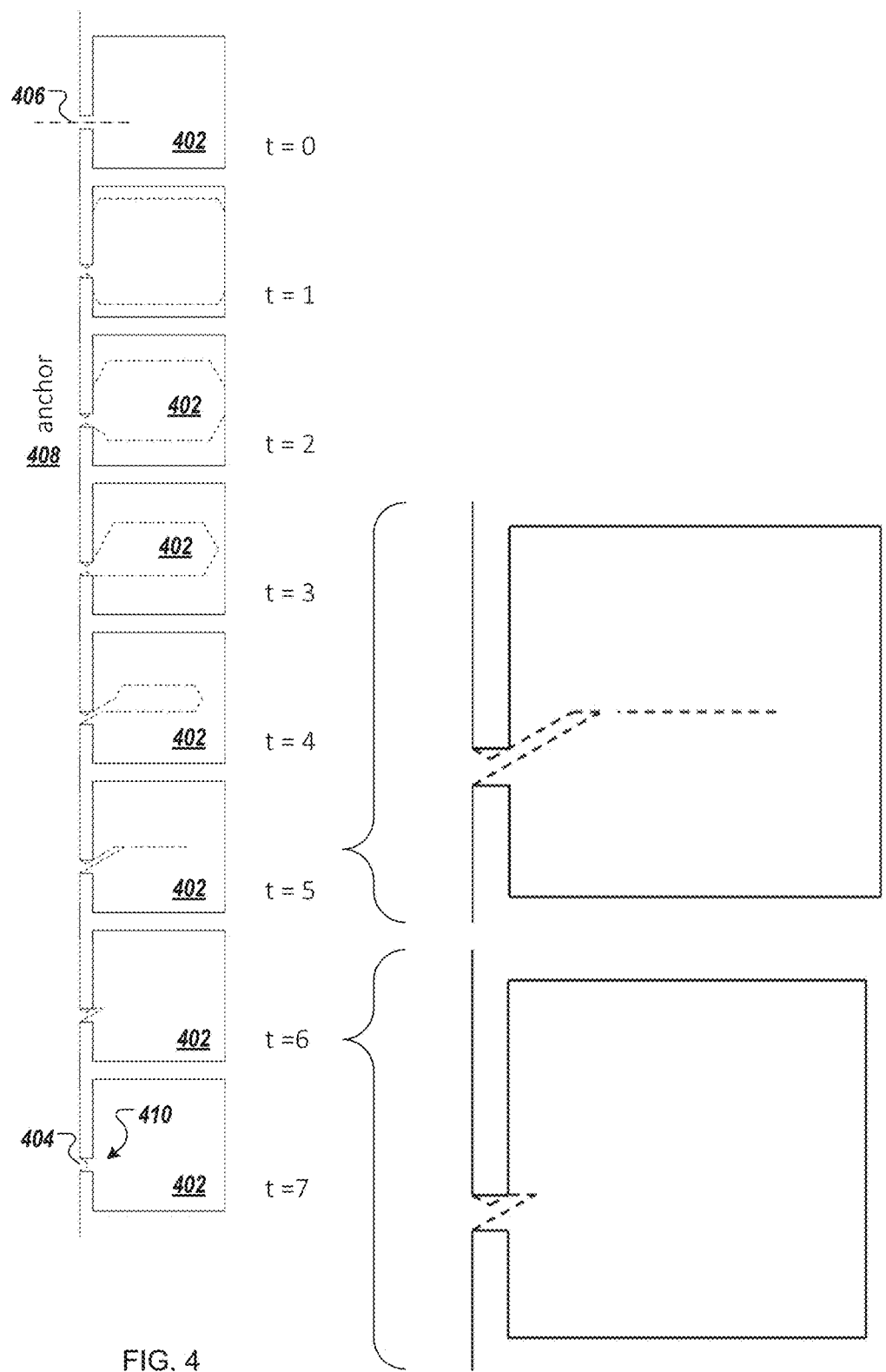
FIG. 4 is an illustration of the process of undercut etching a transferable semiconductor with a single tether placed off-center.

FIG. 4 is an illustration of the process of undercut etching a transferable semiconductor device 402 (corresponding to the active components 106a-106d) with a single tether 404 (corresponding to the tethers 110 of FIG. 1) placed off-center relative to the edge of the device 402, for example by at least 5%, 10%, 20%, 50% or more. In some embodiments, the single tether 404 of a releasable structure, for example, on Si (1 0 0), is placed off-center 406 with respect to the edge of the device 402 on the anchor-facing edge 408 e.g., the tether 404 is not located at the mid-point or along a center line of the device 402. The undercut etch progression reaches completion with the areas 410 near the tether 404 releasing last. In this configuration, the design offers, among other things, added surety that the relaxation of residual stress in the releasable structure is accommodated by free expansion/contraction of the non-tethered edges and does not break the tether 404 and cause yield loss during the release process. Off-center tethers 404, in some embodiments, are more likely to finish with less unreleased regions under a device 402 (e.g., perfectly or near perfectly). As shown in the illustrations in FIG. 4, there is no arrest (stopping) of the etch planes due to the location of the tether 404 in an off-center position.

FIGS. 5A-B are illustrations of an example structure with four tethers 502A-502D (collectively tethers 502 corresponding to the tethers 110 of FIG. 1) per releasable structure 504 (corresponding to the active components 106a-106d). In some embodiments of producing releasable structures 504 on substrates 102 (shown in FIG. 1), such as Si (1 0 0), tethers 502A-D are off-center and are placed at locations on the perimeter of the chip 504 to arrest the etch front 506 by producing concave vertices at the intersection of the slow-etching planes before the structure is released. In some embodiments, pinning from the slow-etching plane is avoided.

In some embodiments, the tethers 502 are designed (e.g., in their placement) such that they do not support concave vertices at the intersection of slow-etching planes, thereby avoiding the arrest of the etch front. Such tethers 502 can, for example, have an aspect ratio of 1.732, for example, for (1 1 1) Silicon. In some embodiments, the aspect ratio is from 1.3 to 1.5, 1.5 to 1.7, 1.7 to 1.9, or 1.9 to 2.1. In some embodiments, the critical aspect ratio of the tether 502 is dependent on the crystal orientation of the etched material. The critical aspect ratio can be determined empirically by etching tethers of different aspect ratios to determine a useful aspect ratio or calculated by comparing the etch rates in the different directions under the preferred etch conditions.

Figure 6B:
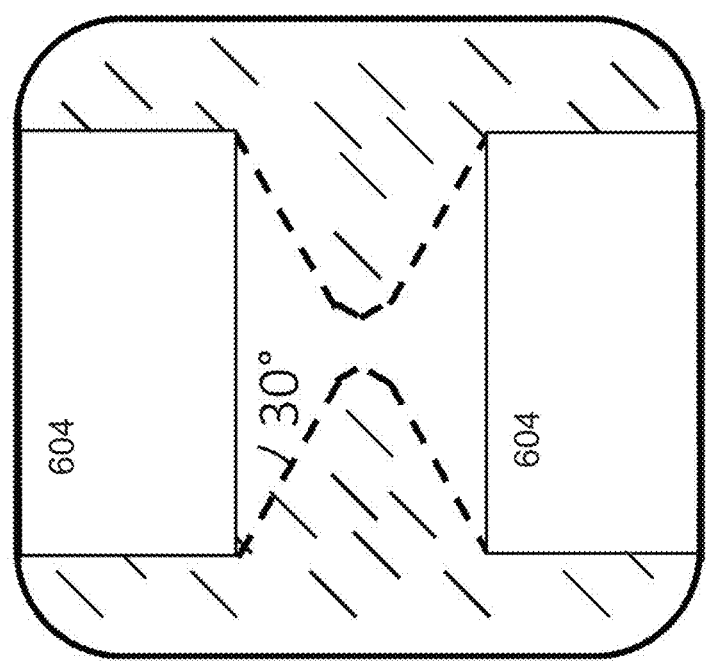
FIGS. 6A and 6B are example illustrations of a tether specific to (1 1 1) silicon.
Figure 6A:
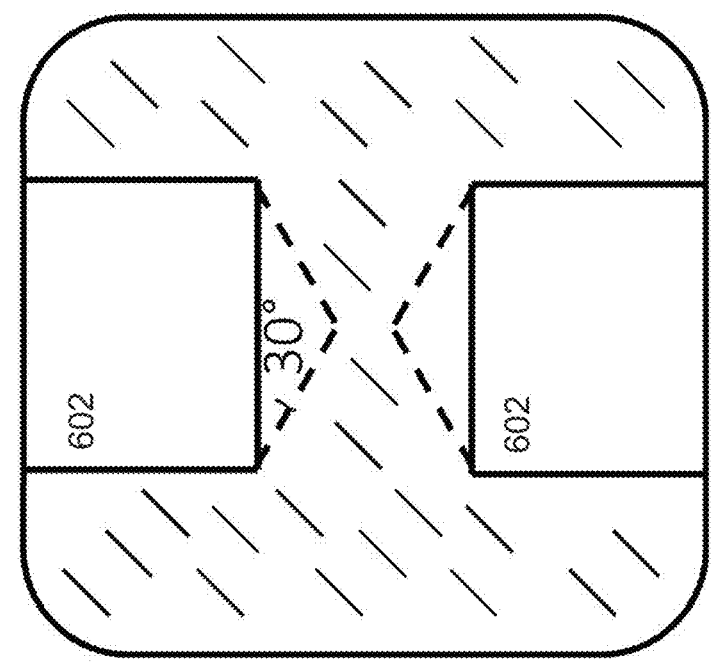
Figure 18:
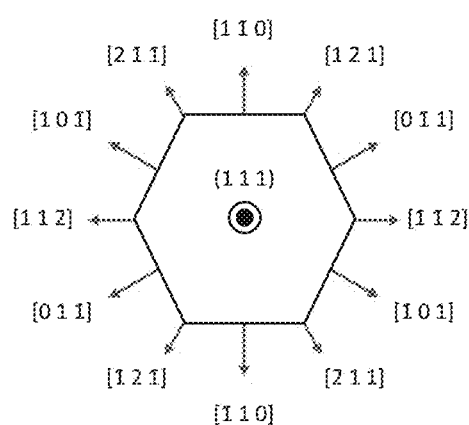
FIG. 18 is an illustration of crystal orientation for semiconductor devices.

FIGS. 6A and 6B are example illustrations of tethers specific to (1 1 1) Silicon. FIG. 18 is a prior-art illustration of crystal orientation for semiconductor devices. The aspect ratio of a tether 602 (corresponding to the tethers 110 of FIG. 1) can be set to avoid pinning from slow-etching planes. Different crystals can have different critical aspect ratios. The tethers 602 shown in FIGS. 6A and 6B have two different aspect ratios since the width of the tether 602 in FIG. 6A is less than the width of the tether 602 in FIG. 6B and the aspect ratio is defined by dividing the width by the height of the tether 602. The tether 602 shown in FIG. 6A has an aspect ratio less than 1.732, and the tether shown in FIG. 6B has an aspect ratio greater than 1.732, respectively. As shown in FIG. 6A, a tether 602 with an aspect ratio less than 1.732 can form vertices (the facing corners of the triangles delineated by dotted lines) that arrest the undercut.

In contrast, as shown in FIG. 6B, a tether 604 with an aspect ratio greater than 1.732 does not arrest undercut.

Figure 7B:
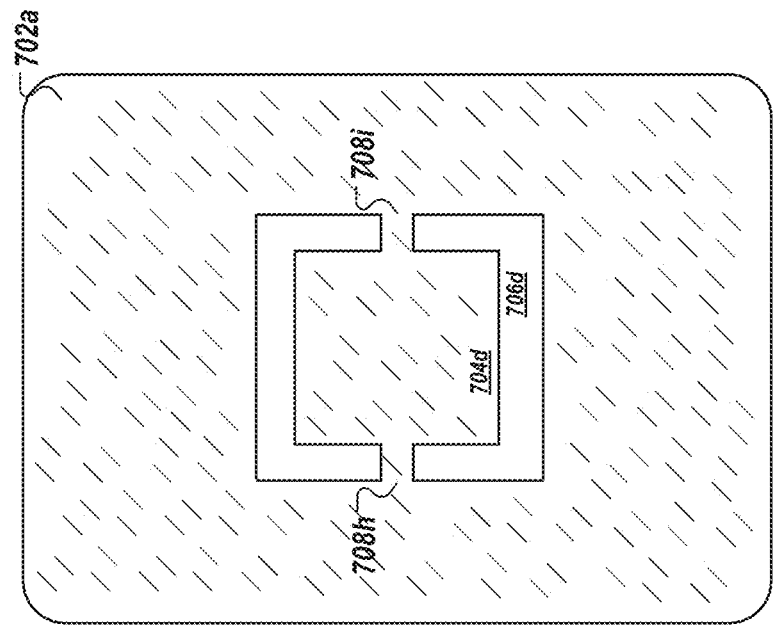
FIGS. 7A and 7B illustrate additional designs for crystallographic selectivity in removing a sacrificial layer from underneath the releasable object and less underneath the anchoring structure.
Figure 7A:
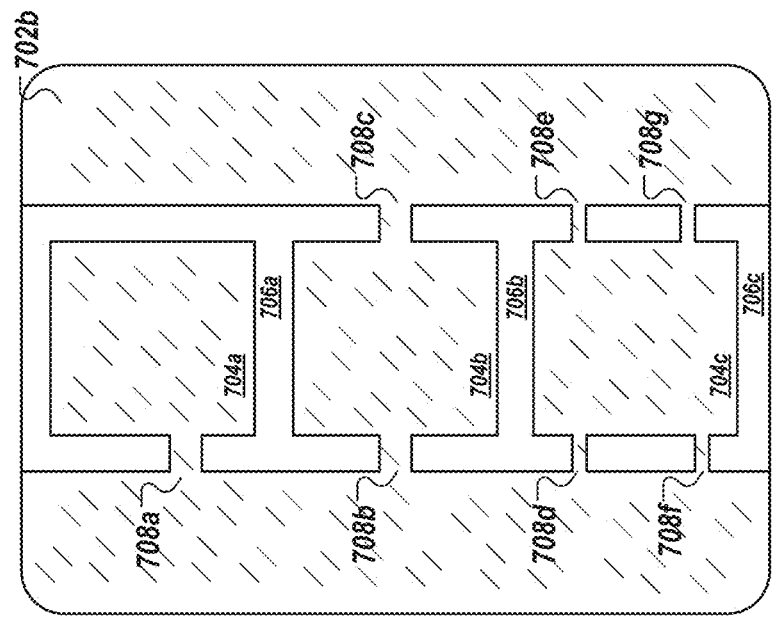

FIGS. 7A and 7B illustrate additional designs for crystallographic selectivity in removing a sacrificial layer 702a and 702b (collectively 702) from underneath the releasable objects 704a-704d (collectively 704 and e.g., such as active components 106a-106c of FIG. 1) while reducing the amount of the sacrificial layer 702 removed from underneath the anchoring structure. In micro assembly, in certain embodiments, it is useful to release micro objects 704a-704d delineated, for example, by trenches 706a-706d (collectively 706) from a first substrate while preserving their orientation and spatial configuration until they are selected (e.g., picked up) by a conformable transfer element, such as an elastomer stamp. Anchor structures that remain rigidly attached to the first substrate and tether structures 708a-708h (collectively 708) that join the releasable micro object to the anchor can serve to maintain the spatial configuration of the micro objects upon the partial or full release of the micro objects 704 from the first substrate. For example, this can be accomplished by the selective removal of a sacrificial layer 702 by etching or ablation or other means. In this example, object 704a is secured to an anchor structure with a single tether 708a, object 704b is secured to an anchor structure with two tethers 708b and 708c, object 704c is secured to an anchor structure with four tethers 708d, 708e, 708f, and 708g, and object 704d is secured to an anchor structure with two tethers 708h and 708i. In some embodiments, each object 704 on a native-substrate is secured with the same number of tethers.

In some embodiments, the etching process to remove the sacrificial layer underneath the releasable micro object has crystallographic dependence in which etching occurs faster in some directions of the crystal structure and slower in other directions of the crystal structure. In those cases, convex or exterior corners of structures (e.g., of the sacrificial layer) etch quicker to progressively produce etch fronts that are parallel to the fast etching planes, as described above. In such instances, concave or internal corners of the structures (e.g., of the sacrificial layer) etch slower, thereby forming a slowly moving or pinned/stopped etch front, which is defined by the slowly etching planes (provided that the resulting etch fronts of the etchants can form and maintain a local shape characterized by the internal/concave corners). Certain release layers (e.g., sacrificial layer) having crystallographic dependence that exhibit this kind of crystallographic selectivity include Si (1 1 1), Si (1 0 0), InAlP, InP, GaAs, InGaAs, AlGaAs, GaSb, GaAlSb, AlSb, InSb, InGaAlSbAs, InAlSb, and InGaP.

Another release layer that exhibits this kind of crystallographic selectivity is Si (1 0 0). In some embodiments, the substrate is a Si wafer with a first surface parallel to the (1 0 0) plane. In these embodiments, heated aqueous bases, such as KOH, NaOH, or TMAH solutions, remove silicon below micro devices. The crystallographic selectivity of the etch process leaves the regions of silicon below anchoring structures unetched or mostly unetched. In these embodiments, the anchoring structures and the micro devices effectively withstand exposure to the heated aqueous bases. In certain embodiments, if the crystal structure of the anchoring structures and the micro devices is different and/or oriented in a particular way, they will not etch readily. Thus, the sacrificial layer can be etched without (e.g., minimally) etching other structures, such as the anchoring structures. Additionally, the in-plane geometry of the anchoring structures and the micro devices determine which regions of the Si (1 0 0) are etched and which regions survive during the exposure to the heated aqueous base. Regions of Si (1 0 0) that are uncovered by an etch mask are etched in the [1 0 0] direction. Anchoring structures that are parallel to the <0 1 1> directions are long and/or have only internal (concave) corners do not undercut but instead protect the regions of silicon underneath the anchoring structures, forming tapered sidewalls perpendicular to the {1 1 1} planes as the etch front progressed downward, thereby forming anchors that persist through an undercut release operation. The crystallographically selective etchants undercut convex corners (external corners), thereby releasing printable objects for micro assembly.

In some embodiments, the anchoring structures are continuous lines that run parallel to the <0 1 1> directions. In some embodiments, the printable structures are tethered to the anchors by a single tethering structure designed to fracture upon retrieval by a transfer element, for example an elastomer stamp. In some embodiments, printable structures are tethered to two anchoring structures that are not aligned in a line parallel to the <0 1 1> directions to avoid pinning of the etch front by the formation of internal corners that do not undercut. In some embodiments, printable structures are tethered by three or more tethers with each tether connecting a printable structure and one of two anchoring structures on opposing sides of the printable structure. In certain embodiments, no two tethers are aligned in a line parallel to the <0 1 1> direction that spans from one anchoring structure to the other anchoring structure on opposing sides of the printable structure, thereby avoiding unwanted pinning of the etch front during the release process. In some embodiments, the tether structures and the <0 1 1> direction form an oblique angle. In some embodiments, the tethers, the printable structure, and the anchors have geometries such that no rectangle with edges parallel to the <0 1 1> directions that has an edge passing through the printable object may be drawn such that all portions of the rectangle are covered by the anchors, tethers, and printable structure.

Figure 21A:
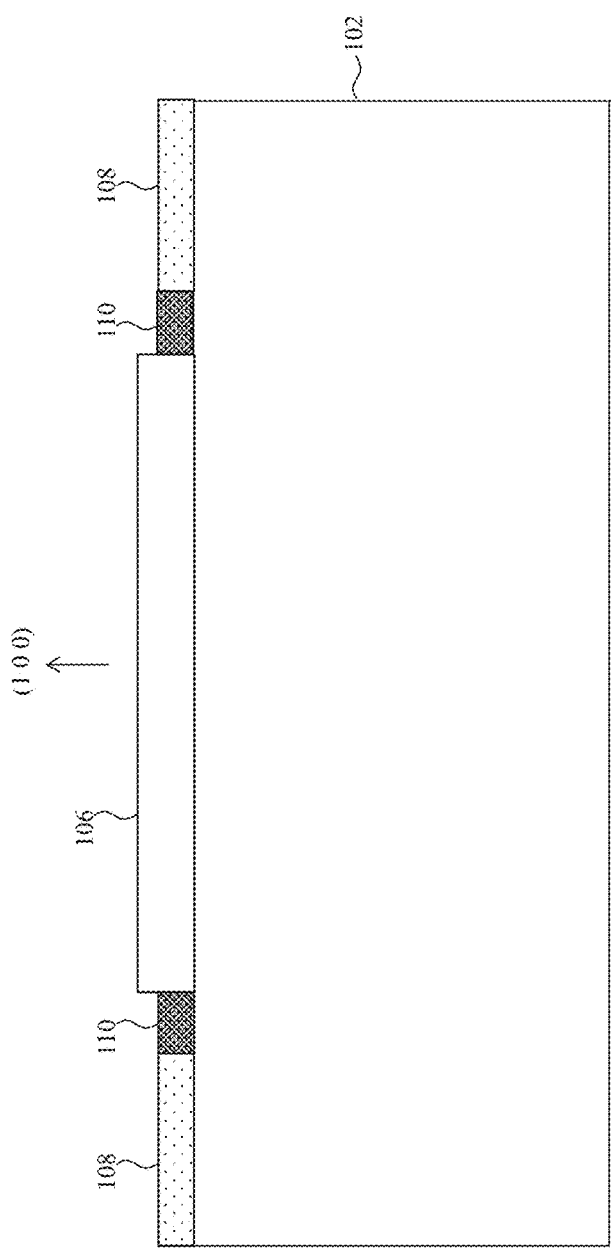
FIGS. 21A and 21B are cross sections of an example tether design with a silicon crystalline structure orientation.
Figure 21B:
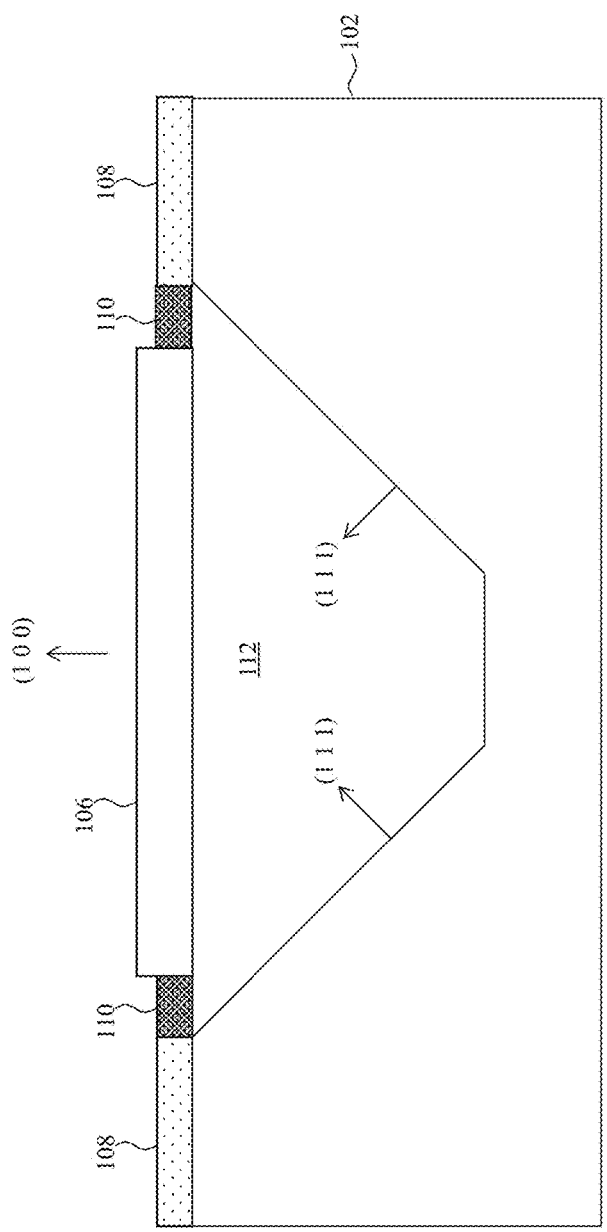

Referring to the cross section of FIG. 21A, a native substrate 102 has an active component 106 formed thereon together with anchors 108 and tethers 110. The native substrate 102 is etched to form the cavity area 112 as shown in FIG. 21B, enabling the printable active component 106 to be released from the native substrate 102 and micro transfer printed to a different, non-native substrate. The silicon crystal orientation is referenced in the figure.

Figure 22:
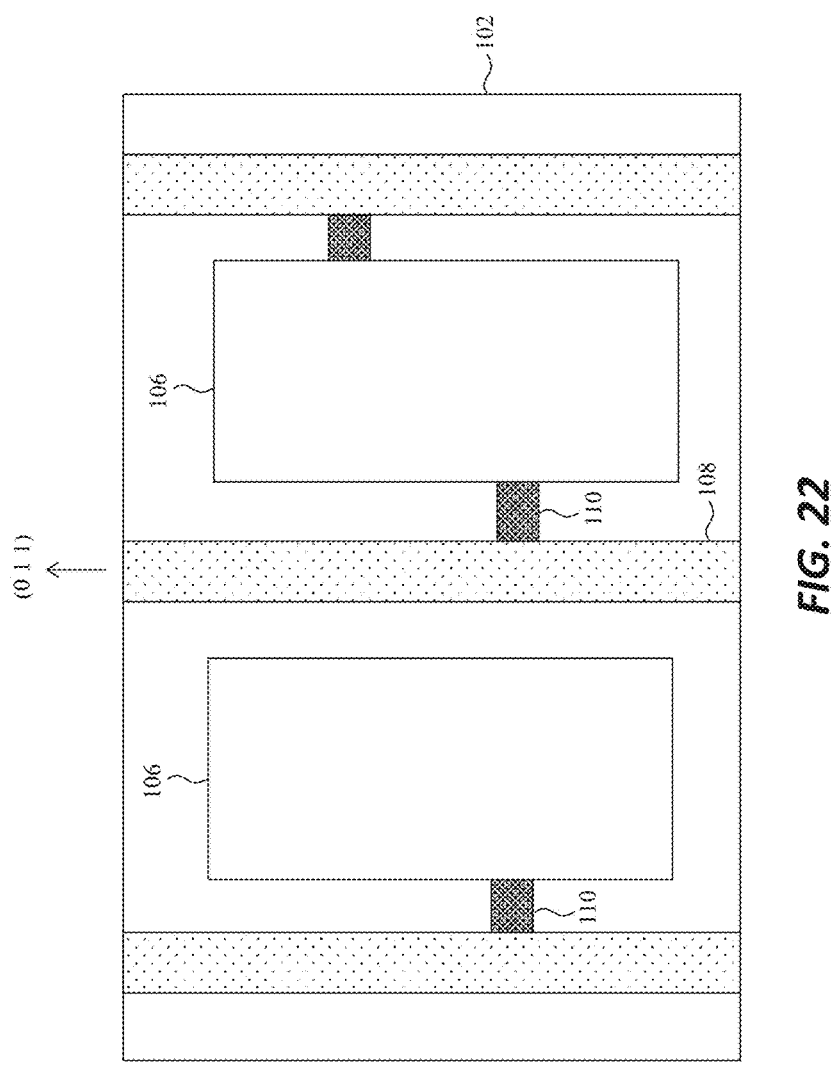
FIGS. 22 through 24 are illustrations of tether designs according to embodiments of the present invention.
Figure 23:
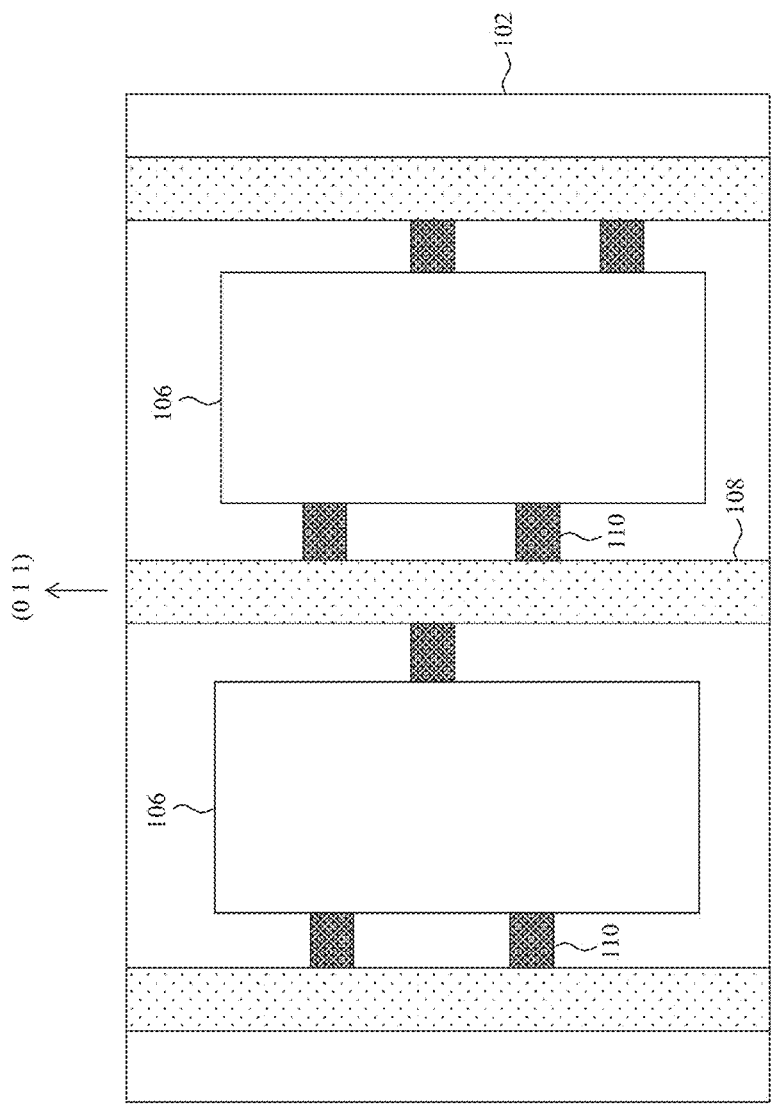

FIGS. 22 and 23 illustrate geometries of Si 1 0 0 that will produce releasable and micro transfer printable active components 106. The plan view of FIG. 22 illustrates the same structure as in FIGS. 21A and 21B with a single offset tether 108 to the printable micro-device 106 on the left side and double offset tethers 108 to the printable active component 106 on the right side. Offset tethers are offset with respect to a side of the printable active component 106. The plan view of FIG. 23 also illustrates the same structure as in FIGS. 21A and 21B with triple tethers 108 to the printable active component 106 on the left side (at least one, two, or all of which are offset) and quadruple offset tethers 108 to the printable active component 106 on the right side (at least one, two, three, or all of which are offset).

Figure 24:
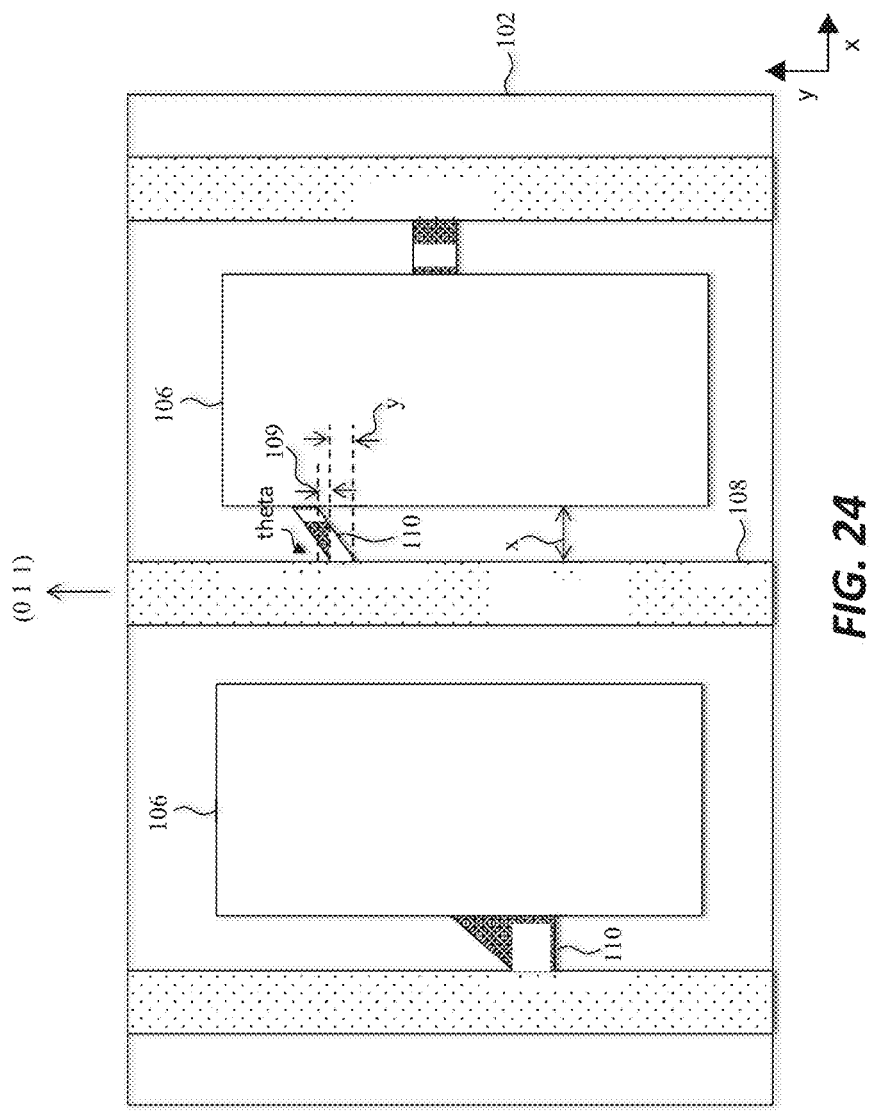

FIG. 24 illustrates tethers 108 that have edges that are non-orthogonal to edges of the printable active component 106 or anchor and that are non-orthogonal to the crystalline direction [0 1 1]. Furthermore, in an embodiment, the portion of the tether 110 in contact with the anchor 110 is not between the portion of the tether 110 in contact with the printable active component 106 in the y-direction, for example separated by a distance 109, as shown in FIG. 24.

Figure 26:
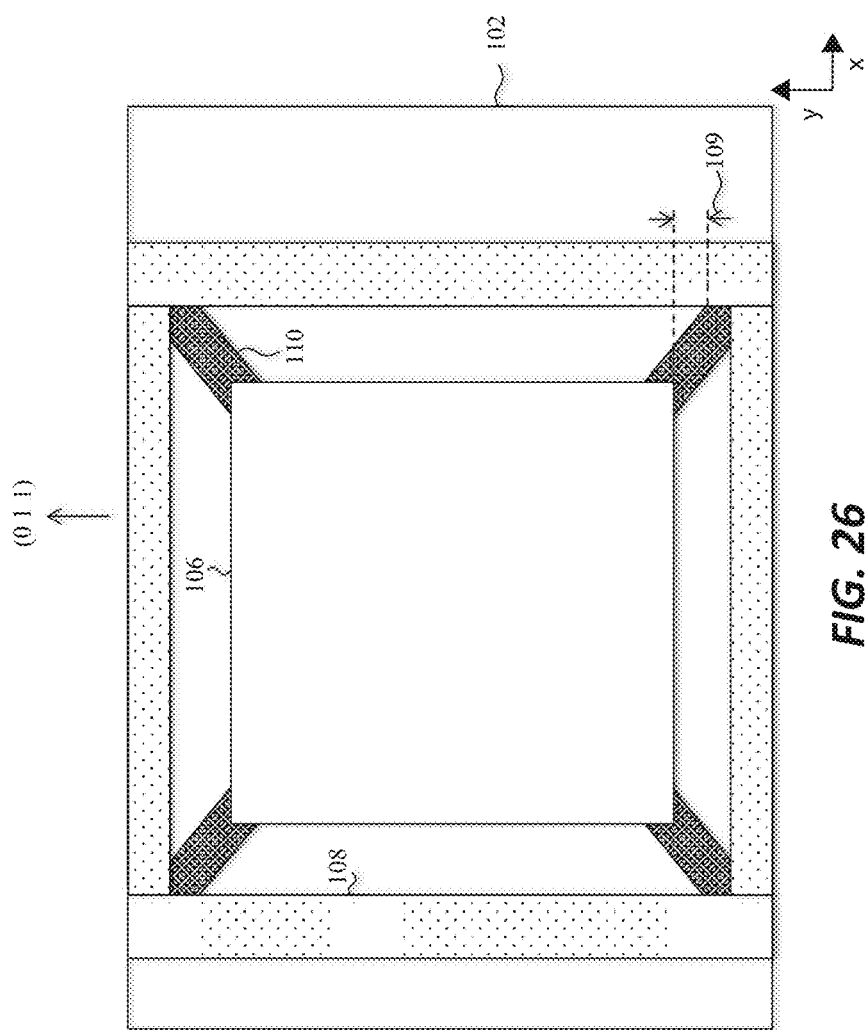
FIG. 26 illustrates an embodiment with tethers attached to the corners of the releasable micro object in accordance with an embodiment of the invention.

Mathematically, in this embodiment the releasable micro object 106 is separated from the anchor 108 in the x-direction by a separation distance x, the tether 110 is attached to the anchor 108 or the releasable micro object 106 at an acute angle theta, the distance between the first edge and second edge of the tether at which the tether 110 is attached to the anchor 108 or releasable micro object 106 is y, and y is less than or equal to x*tan(theta). Thus, x is the gap between the anchor 108 and the releasable micro object 106, theta is the angle of the tether 110 with respect to the anchor 108 or the releasable micro object 106 (with an angle of zero indicating that the tether 110 is parallel to the edge of the anchor 108 or the releasable micro object 106), and y is the width of the tether 110 in a direction parallel to the edge of the anchor 108 or parallel to the edge of the releasable micro object 106. FIG. 26 illustrates an embodiment with similar tethers 110 attached to the corners of the releasable micro object 106. These structures release more readily because etch fronts from neighboring ingress points on either side of the tether 110 will overlap and produce an etch mask structure with all convex (exterior) corners and no concave corners.

Thus, in a releasable embodiment, the tether 110 has opposing sides that are not attached to the anchor 108 or the releasable micro object 106 and the opposing sides overlap in at least one of the y-direction and the x-direction.

Figure 25:
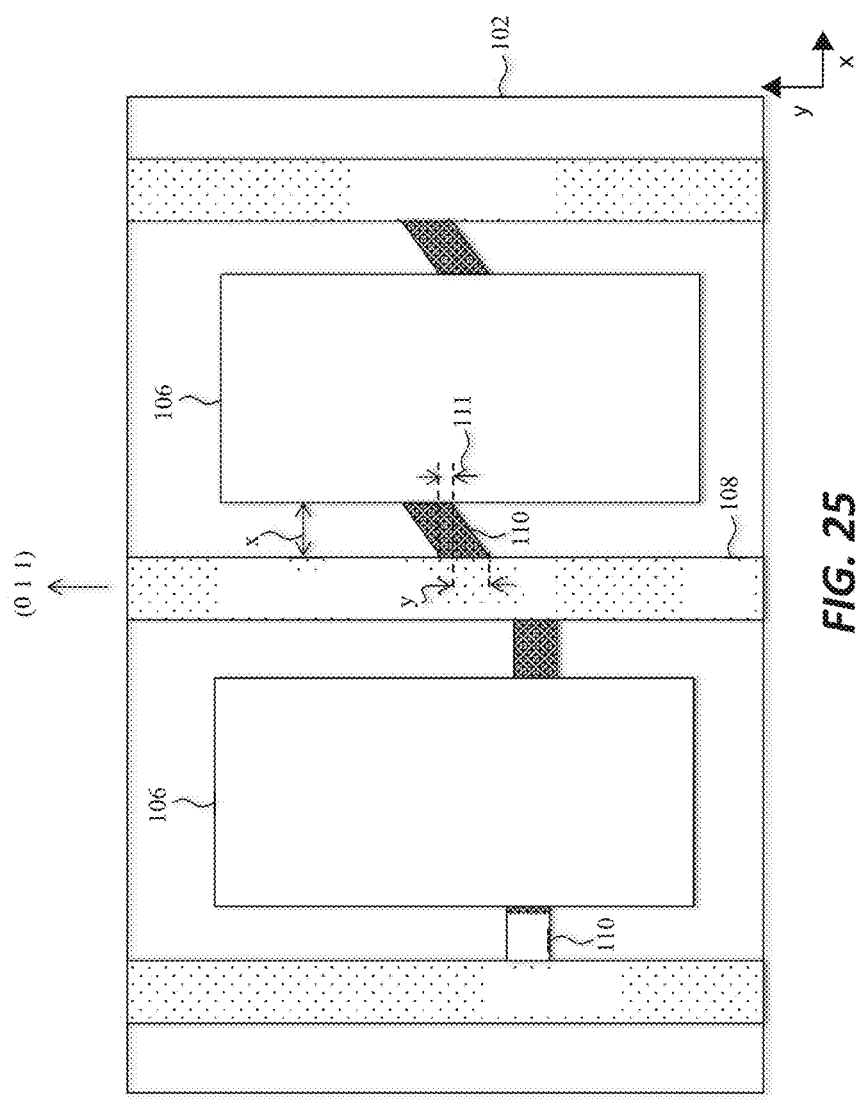
FIG. 25 is an illustrative counterexample of tether structures and silicon crystalline orientation that do not etch effectively.
Figure 27:
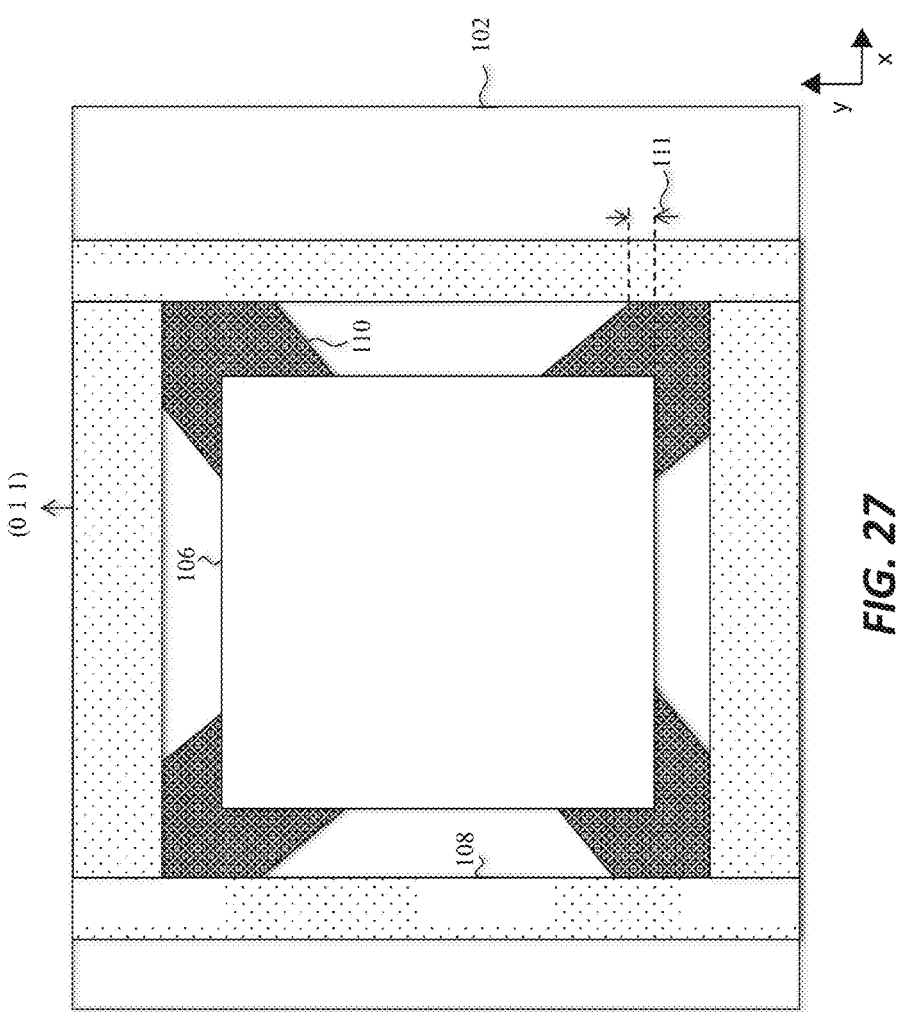
FIG. 27 illustrates corner tethers that also have an overlapping distance.

In contrast to the embodiments of FIGS. 22-24, FIG. 25 illustrates arrangements of tethers 108, anchors 110, and printable active component 106 that do not form an effective release structure because the etch fronts are pinned. In these cases, similar tethers 108 are not offset. As shown in FIG. 25, the portion of the tether 108 in contact with the anchor 110 overlaps the portion of the tether 108 in contact with the printable active component 106 in the y-direction, for example overlapping by a distance 111. FIG. 27 illustrates corner tethers 110 that also have an overlapping distance 111. These structures do not release as readily because etch fronts from each ingress point above and below the tether 110 will terminate by slow-etching planes and all concave corners before they overlap.

Figure 28:
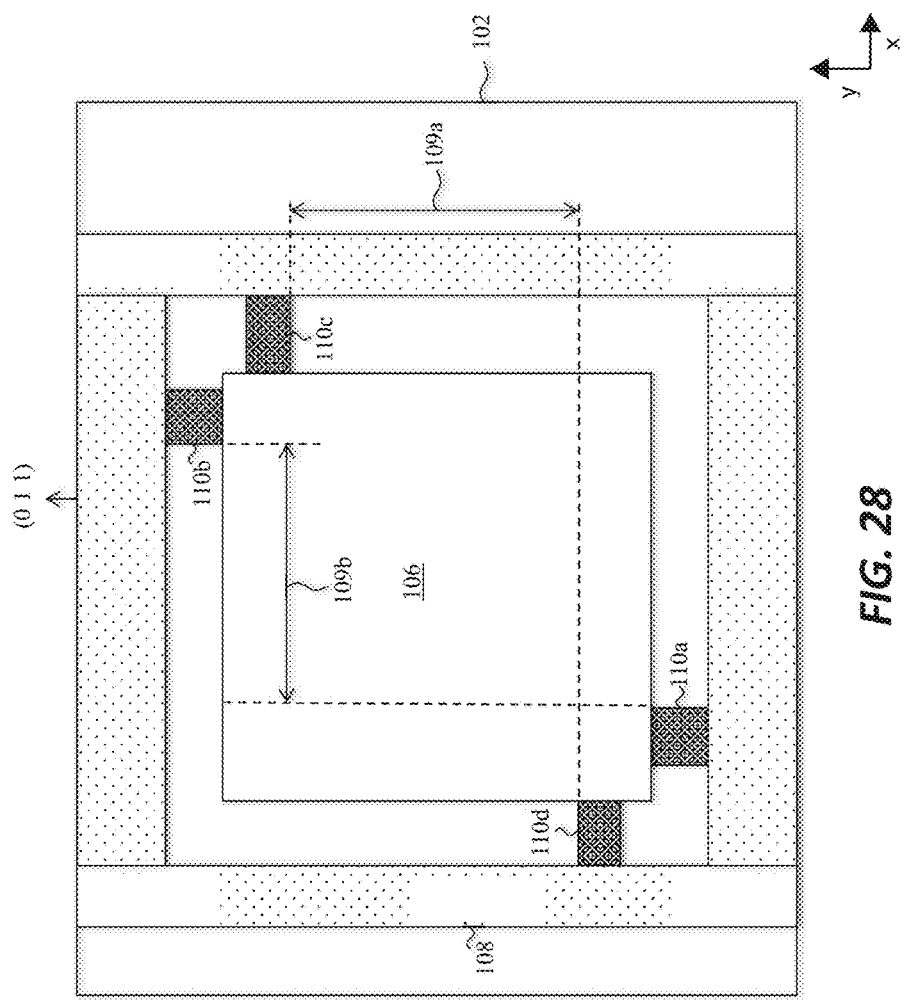
FIG. 28 illustrates a first pair of tethers that are offset in the y-direction and do not overlap in the offset direction as shown with distance and a second pair of tethers that are offset in the x-direction and do not overlap in the offset direction as shown with distance.
Figure 29:
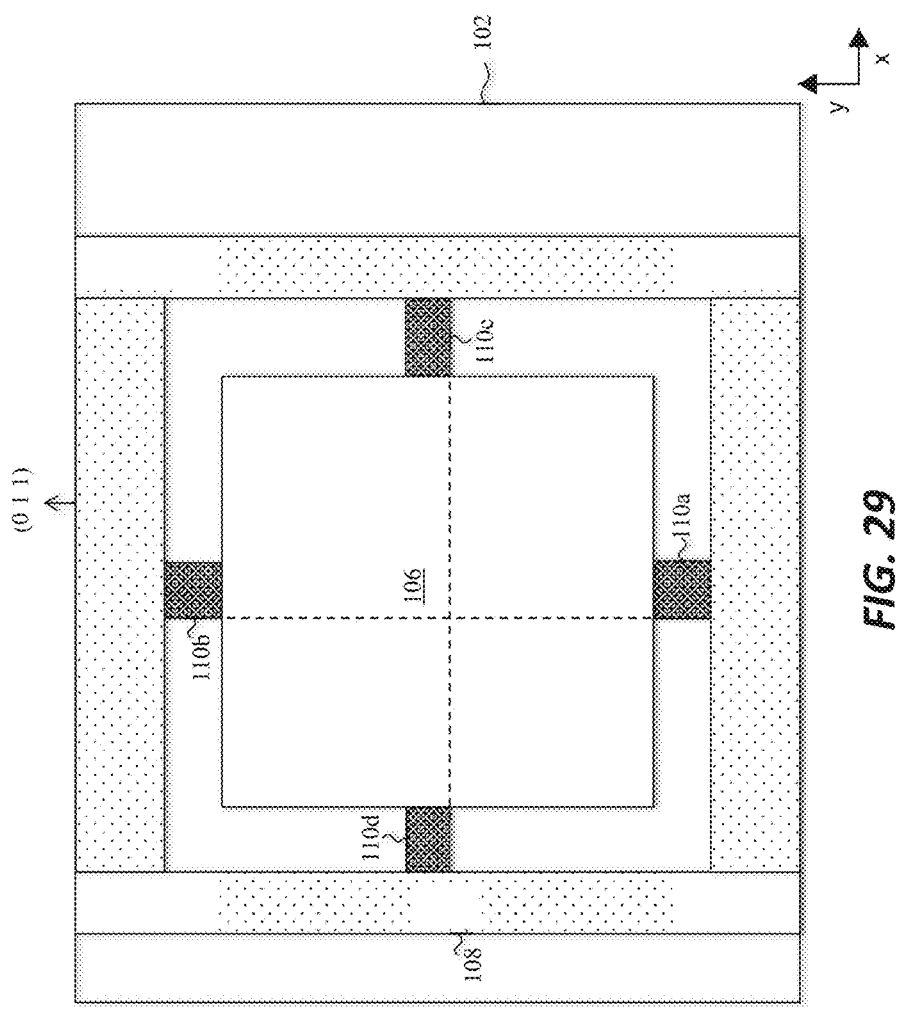
FIG. 29 illustrates a configuration that will have difficulty releasing.
Figure 30:
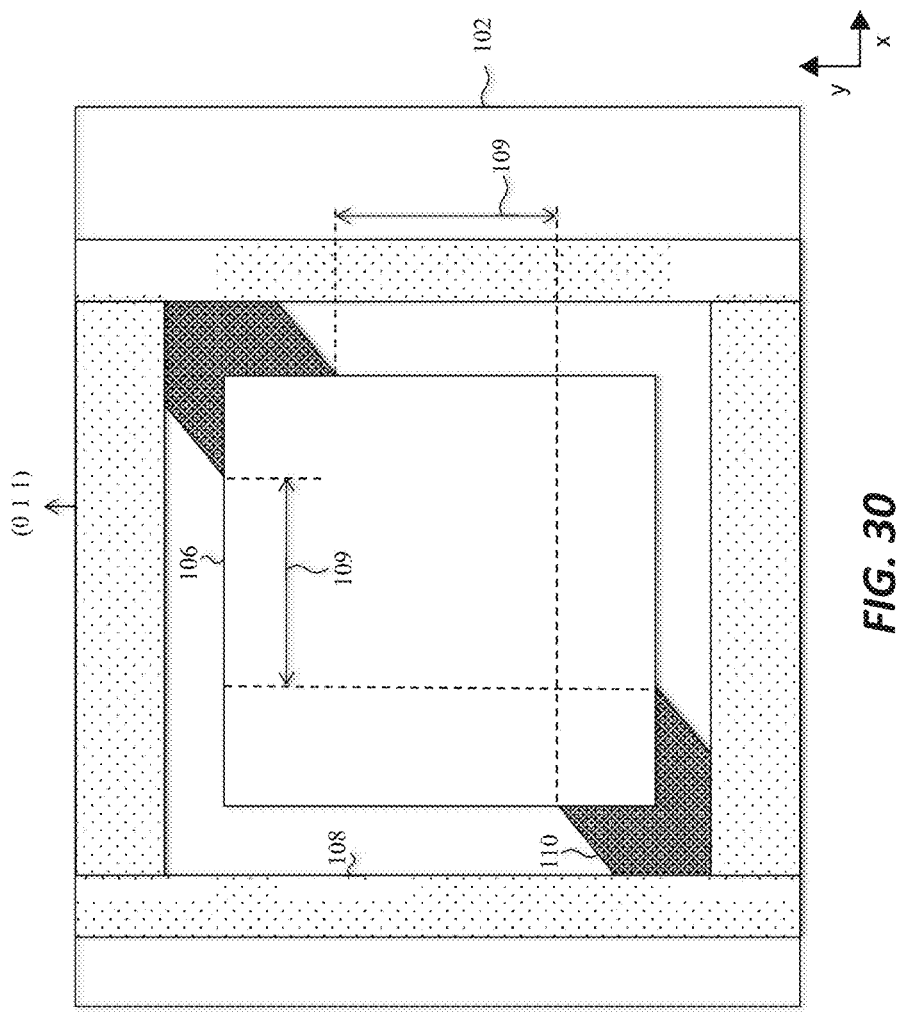
FIG. 30 illustrates a pair of tethers that are offset in both the x-direction and y-direction and do not overlap in either offset direction.

In another releasable embodiment referring to FIG. 28, a first pair of tethers 110a, 110b are offset in the y-direction and do not overlap in the offset direction as shown with distance 109a and a second pair of tethers 110c, 110d are offset in the x-direction and do not overlap in the offset direction as shown with distance 109b. This structure releases because etch fronts from neighboring ingress points will overlap and produce etch mask structure with all convex (exterior) corners; no concave corners. In contrast, FIG. 29 will have difficulty releasing because the tethers 110 are not offset and etch fronts from each ingress point will terminate by slow-etching planes and all concave corners before they overlap. In FIG. 30 the pair of tethers are offset in both the x-direction and y-direction and do not overlap in either offset direction. Thus, the structure can release effectively.

To address this effect, in some embodiments, a sacrificial layer is provided that at least temporarily spans the entire area of the first substrate, both in the regions used to form releasable micro objects and in the regions used to form anchoring structures. In addition, in those applications, a continuous structure, spanning more than one releasable micro object in at least one dimension is employed. Alternatively, in some embodiments, the anchor is positioned about the releasable micro objects.

In such embodiments, the anchoring structure is characterized by locally concave or internal corners and the releasable micro objects are locally characterized by convex or external corners. In such configurations, the etch progresses rapidly (e.g., relative to the rate at which the anchoring structures are released) under the releasable micro object.

In some embodiments, the tethers are designed to not support the establishment of locally-concave or internal corners. In such embodiments, the tethers are configured, for example, with a narrow shape (e.g., a width of from 10 nm to 100 nm, 100 nm to 500 nm, 500 nm to 1 micron, or 1 micron to 10 microns).

In certain embodiments, the goal is to avoid forming geometries of the tech-blocking materials (i.e., anchors, tethers, and printable structures) that arrest the etch process. For example, for certain geometries of the tech-blocking materials, it is not possible to draw a rectangle covered by the anchors, tethers, and micro object with an edge parallel to the <0 1 1> directions that has an edge passing through the micro object.

In certain embodiments, the tethers are formed on a different plane than the top surface of the release layer (e.g., silicon or other release layer on the substrate). Specifically, the tethers in this embodiment forms air bridges over the release layer such that the tethers do not arrest the etch process regardless of the plan view layout of the tethers.

For example, in certain embodiments, anchor structures formed in direct contact with a release later that has anisotropic etch characteristics (e.g., Si 100, Si 111, InAlP, or InAlGaAs). A printable device formed in direct contact with the release layer. Tether structures (i.e., that can be fractured during printing) physically connect the printable device to the anchors, but are at least partly disconnected from the release layer (like air-bridges) such that one may outline an imaginary polygon entirely on the exposed surface of the release layer that encircles the printable device with the tethers forming air bridges over that imaginary polygon. In that way, the etch blocking structures are characterized by the printable device and not the tethers. The resulting etch mask is characterized by convex corners (exterior corners) and will not arrest the etching of the release layer. The imaginary polygon can be described as a convex hull, wherein convex hull means a polygon drawn around a surface structure that has no concave corners—like a rubber band around the surface structure.

Figure 31A:
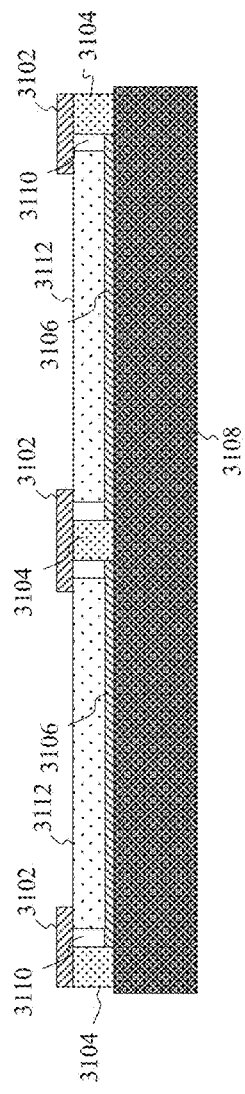
FIGS. 31A and 31B are illustrations of examples of tether and anchor arrangements.
Figure 31B:
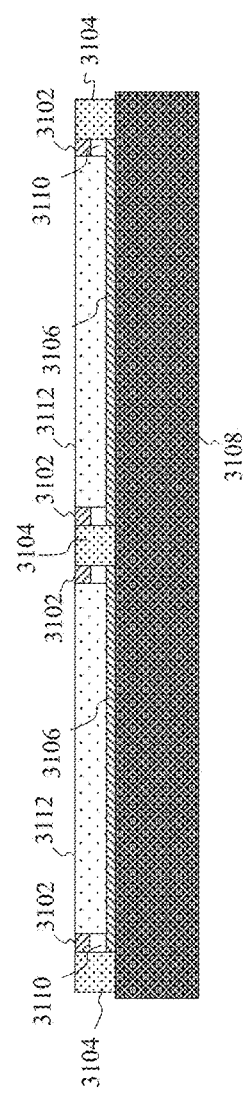

FIGS. 31A and 31B illustrate various embodiments of tether structures 3102 and anchor structures 3104 in which the tethers 3102 are at least partly disconnected from the release layer 3106. The release layer 3106 in these illustrations is on the substrate 3108, although in some embodiments the release layer 3106 is a portion of the substrate 3108 itself. The printable devices 3112 are formed on the release layer 3106. The tethers 3102 connect the devices 3112 to the anchors 3104 such that the spatial orientation of the devices 3112 is maintained by the anchors 3104 and tethers 3102 when the release layer 3106 is removed. As shown in FIGS. 31A and 31B, the tethers 3102 are arranged such that a gap 3110 (e.g., air gap) exists between the tethers 3102 and the release layer 3106.

Figure 8:
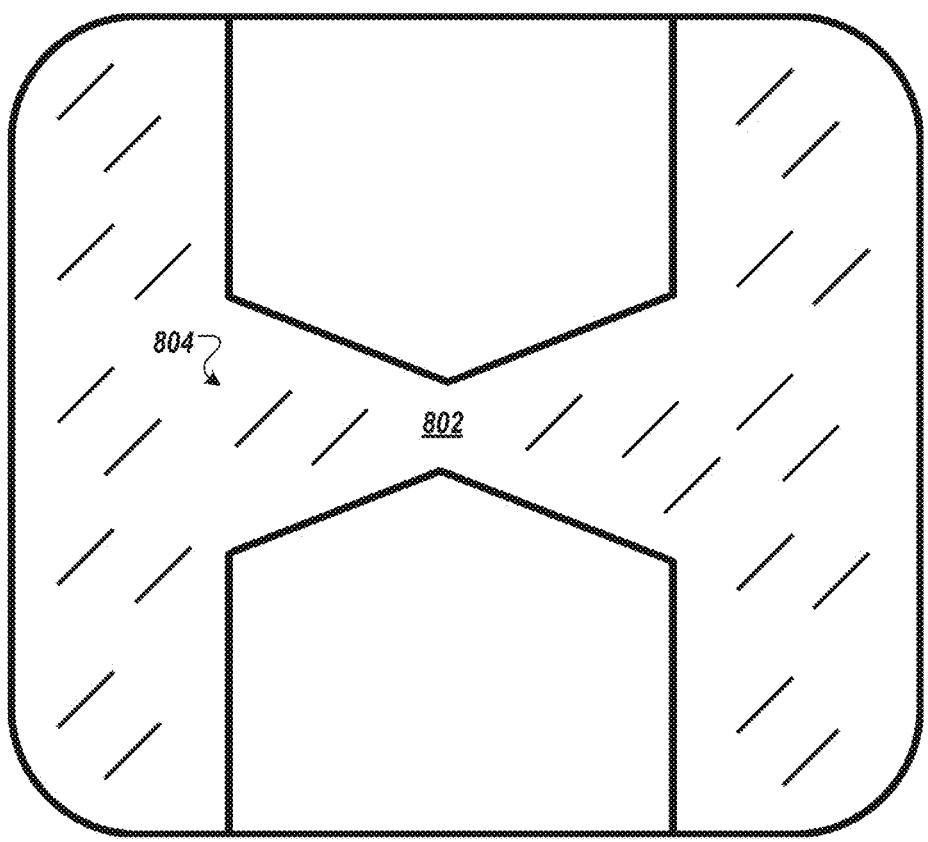
FIG. 8 is an illustration of an example notch implemented in a tether.

To promote a controlled release of the printable micro devices from the fabrication substrate, the tether can be shaped to provide a consistent point of separation. FIG. 8 is an illustration of an example notch 802 implemented in a tether 804 corresponding to the tethers 110 of FIG. 1. Notches 802 in tethering structures can be used to facilitate controlling the point of fracture when a released micro object is retrieved by a transfer element such as a structured elastomer stamp. The width of the notch 802 can be used to control the force required to fracture a tether 802 when a released micro object (e.g., partially released) is removed by a transfer element.

Figure 9:
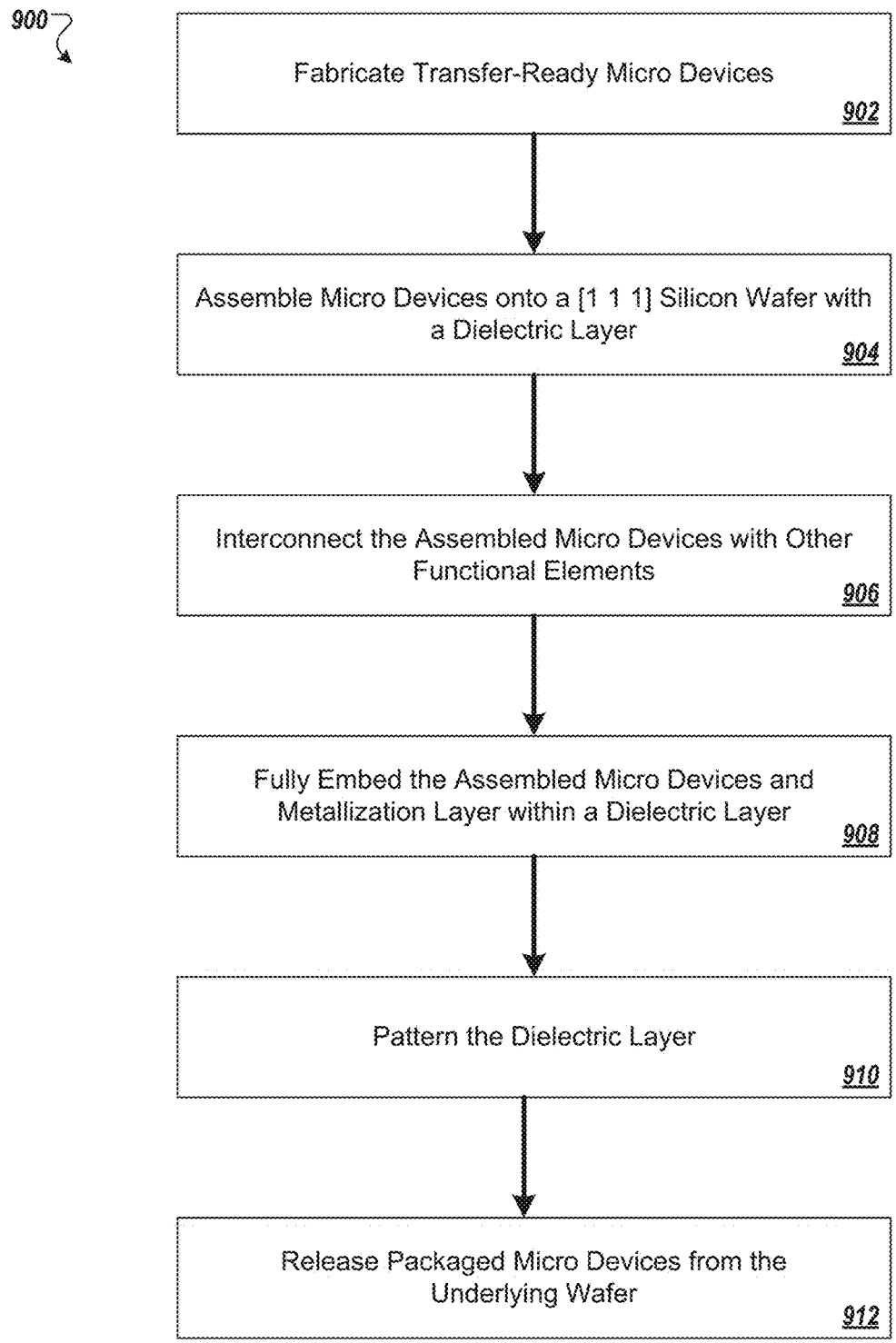
FIG. 9 is a flowchart of an example method for providing ultra-thin low-cost packaged devices using (1 1 1) silicon.

In another aspect of the disclosure, the disclosed technology enables the fabrication and manufacturing of ultra-thin low-cost packaged micro-scale devices using (1 0 0) silicon. FIG. 9 is a flowchart of an example method 900 for providing ultra-thin low-cost packaged micro-scale devices using (1 0 0) silicon. Transfer-ready micro-scale devices, such as micro-scale integrated circuits or LEDs, are first fabricated (step 902). The micro-scale devices are assembled, for example, onto a (1 0 0) silicon wafer with a dielectric layer (step 904). In some embodiments, other types of wafers can be used as a destination substrate for the micro devices, for example glass, plastic, or metal. In some embodiments, thin-film metallization processes can be used to interconnect the assembled micro devices with other functional elements (step 906). The assembled micro-scale devices and metallization layer can be fully embedded within a dielectric layer (step 908). The dielectric layer can be patterned (step 910) and the packaged micro-scale devices can be released from the underlying wafer (step 912) and transferred to another substrate. Various processes can be used to release the micro-scale devices from the underlying wafer such as those disclosed herein (e.g., see above).

Figure 10A:
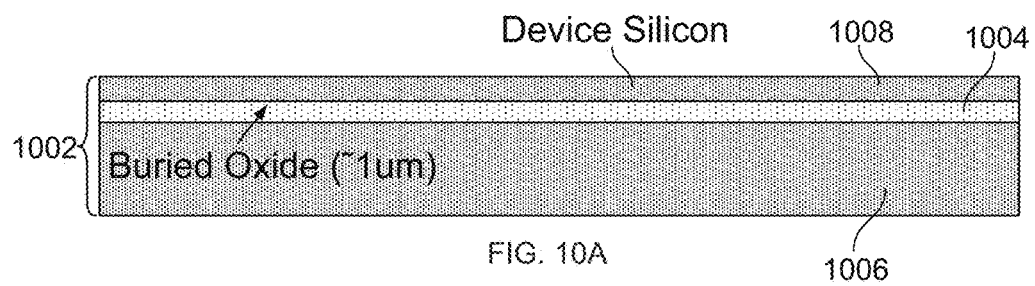
FIGS. 10A through 10D illustrate a processor for making transfer-ready integrated circuits using a silicon-on-insulator wafer with a (1 1 1) handle wafer.

FIGS. 10A through 10D illustrate a process for making transfer-ready integrated circuits using a silicon-on-insulator wafer. In some embodiments, a (1 0 0) handle wafer is employed. As shown in FIG. 10A, the source substrate, in this example, is a silicon-on-insulator wafer 1002. In some embodiments, other types of wafers such as semiconductor or metal wafers can be used. The starting wafer includes a handle wafer with (1 0 0) orientation. A buried oxide layer 1004 (e.g., ~1 μm thick) is directly on a top surface of the source substrate 1006. A device silicon layer 1008 is provided directly on the top surface of the buried oxide layer 1004.

Figure 10B:
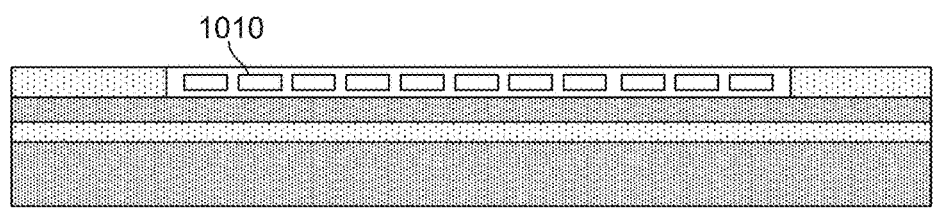

As shown in FIG. 10B, one or more integrated circuits 1010 (collectively devices 1010) are fabricated (directly or indirectly) on the device silicon layer 1008. The device silicon layer 1008 can be thick enough to behave like bulk silicon, can be partially depleted, or can be fully depleted and can have, for example, a thickness of less than a micron, one micron, or a few microns (e.g. 2 microns), 10 microns, 50 microns, 100 microns, or 1000 microns. The process can include providing multiple wiring levels. In some embodiments, a terminal inorganic dielectric passivation layer is provided such that none of the wiring metallization of device silicon is exposed.

Figure 10C:
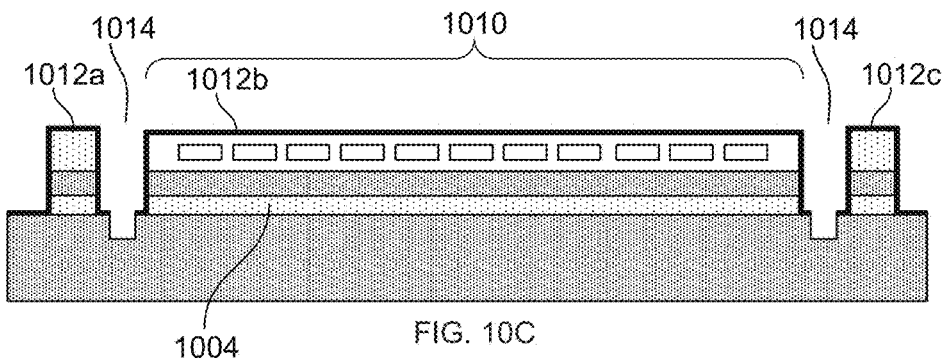
Figure 10D:
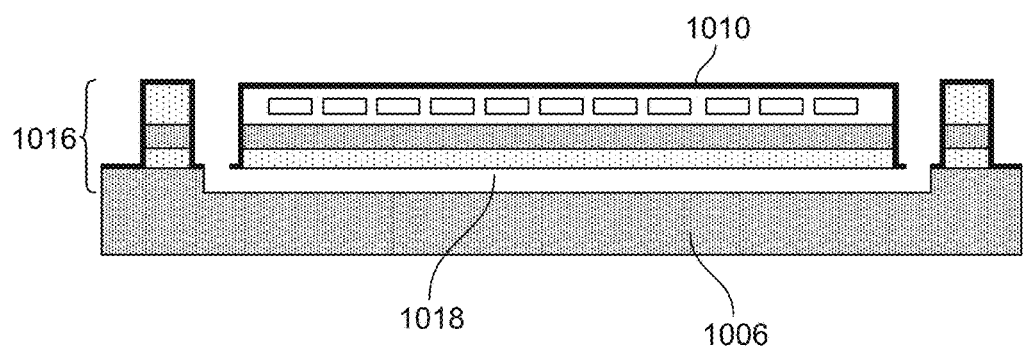

As shown in FIG. 10C, the micro device is defined by patterning and etching trenches 1014 through the dielectric layers around the perimeter of the device 1010. The device silicon layer is also patterned. If there is device silicon exposed at the perimeter of the device, an inorganic dielectric layer can be deposited to passivate this exposed silicon. The passivation layer is then patterned forming inorganic dielectric portions 1012a, 1012b, and 1012c. In some embodiments, the silicon is etched to an appropriate depth 1016 to release the device 1010 (FIG. 10D). As shown in FIG. 10D, the device 1010 is released from the source substrate 1006 by undercutting a sacrificial layer 1018 using techniques such as those disclosed herein (e.g., as described above). After performing the undercutting process, the devices 1010 are held in place by anchors and/or tethers (not shown in FIG. 10D) as described above.

Figure 11A:
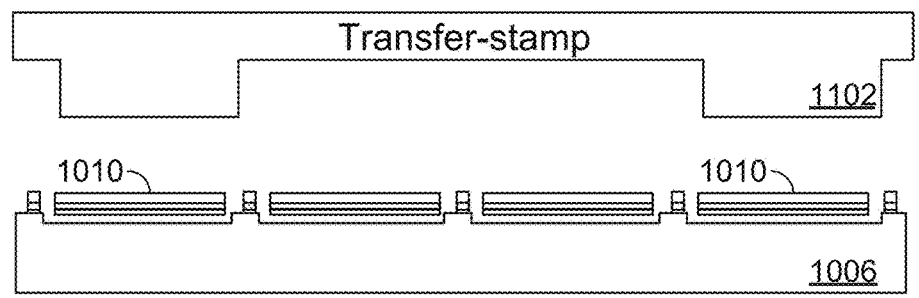
FIGS. 11A through 11C illustrate an example process of assembling a low-cost carrier wafer using micro-assembly techniques using elastomer stamp micro-transfer-printing to pick-up and place the thin micro devices onto another carrier wafer.
Figure 11B:
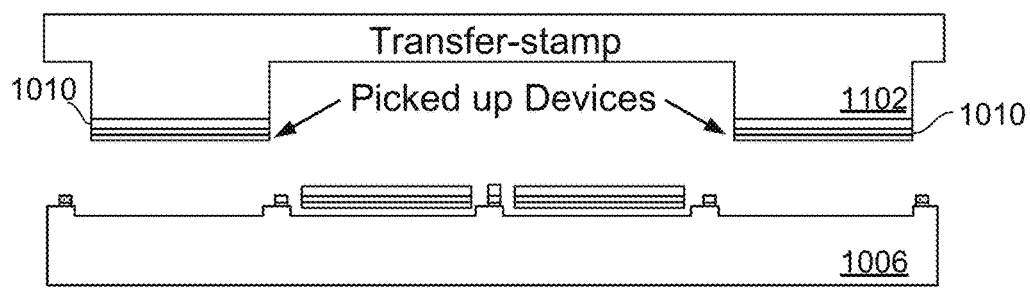
Figure 11C:
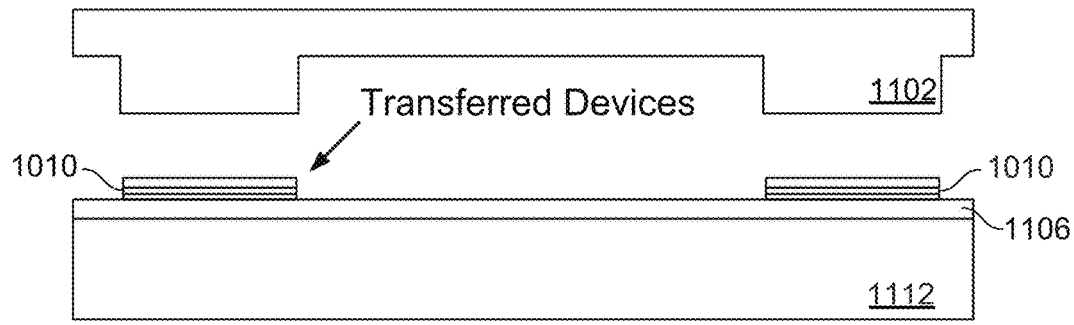

FIGS. 11A through 11C illustrate an example process of assembling a low-cost carrier wafer using micro-assembly techniques using elastomer-stamp micro-transfer-printing to pick up and place the thin micro-scale devices onto another carrier wafer. FIG. 11A illustrates a transfer-stamp 1102 as it approaches one or more transfer-ready micro-scale devices (e.g., integrated circuits) 1010 on a source wafer 1006. FIG. 11B illustrates the transfer-stamp 1102 picking up the devices 1010 from the source wafer 1006. The devices 1010 are transferred to a low-cost carrier wafer 1112 as shown in FIG. 11C. In some embodiments, a layer 1106 is formed on the carrier wafer 1112, such as an insulation layer or polymer layer (e.g., a tacky polymer layer). Example transfer techniques are described in U.S. Pat. Nos. 7,622,367, 7,943,491, and 8,506,867, each of which is hereby incorporated by reference.

Figure 12A:
FIGS. 12A through 12C illustrate an example method for generating a touch, thin, and low-cost packaged device using the (1 1 1) system.
Figure 12B:
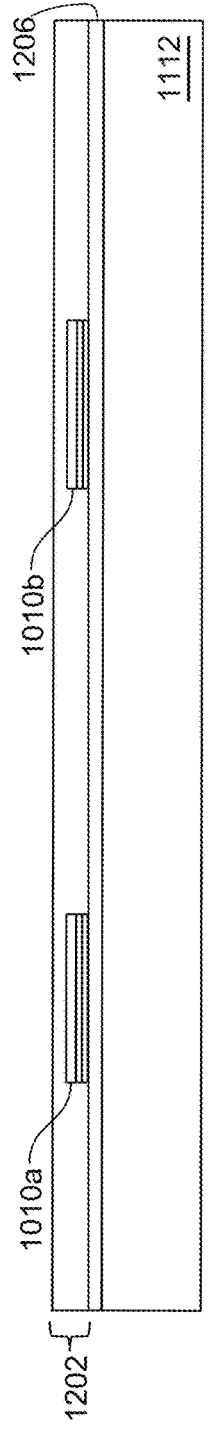
Figure 12C:
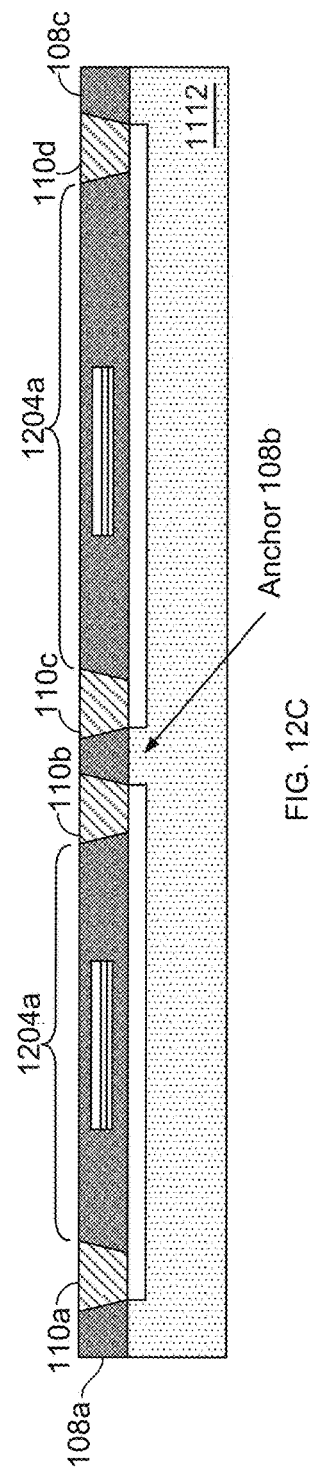

FIGS. 12A through 12C illustrate an example method for generating thin and low-cost packaged micro-scale devices using the (1 0 0) system. As shown in FIG. 12A, micro-scale devices 1010a and 1010b (collectively 1010) are assembled onto the carrier wafer 1112 using micro assembly techniques. The carrier wafer 1112, in some embodiments, is (1 0 0) oriented silicon and includes a dielectric layer 1206. The dielectric layer 1206 can be organic (e.g., polyimide) or inorganic (e.g., silicon dioxide). In some embodiments, the assembled micro-scale devices 1010 are embedded within a second layer 1202 of dielectric as shown in FIG. 12B. This second embedding dielectric 1202 can be organic (e.g., a spin coated polyimide) or can be a deposited inorganic material. Referring to FIG. 12C, the dielectric layers 1202 and 1206 can be then patterned in a manner that defines the desired micro-scale device packages 1204a and 1204b that each include a micro-scale device 1010 and also defines the anchors 108a-108c and tethers 110a-110d (as described above). In some embodiments, the micro-scale device 1010 packages are then released from the wafer 1102 using the undercut removal process as described above, for example. The resulting wafer-level thin and low-cost micro-scale device 1010 packages are suitable for transfer to other substrates using, for example, vacuum collets. In some embodiments, pad structures are formed on top or bottom surfaces of the embedded micro-scale devices 1010, thereby forming a surface-mountable device.

Figure 13:
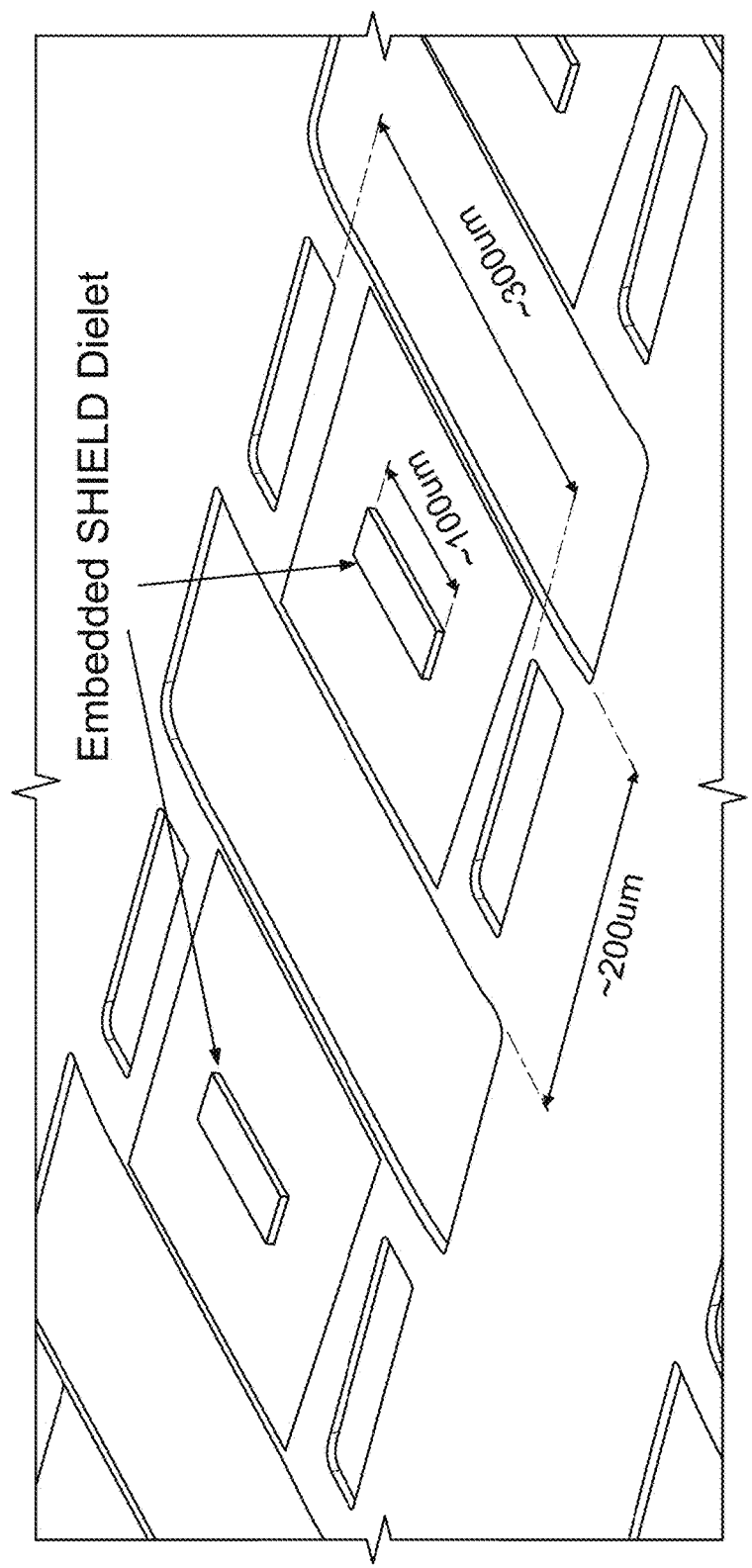
FIG. 13 is an illustration of an example of a substrate with released dielectric structures thereon.

FIG. 13 is an illustration of an example destination substrate with micro-scale devices printed into a structure. The destination substrate can be made of an inorganic material, such as silicon dioxide, glass, or a metal. Printed micro-scale devices can be embedded within the structures as shown in FIG. 13.

Figure 14:
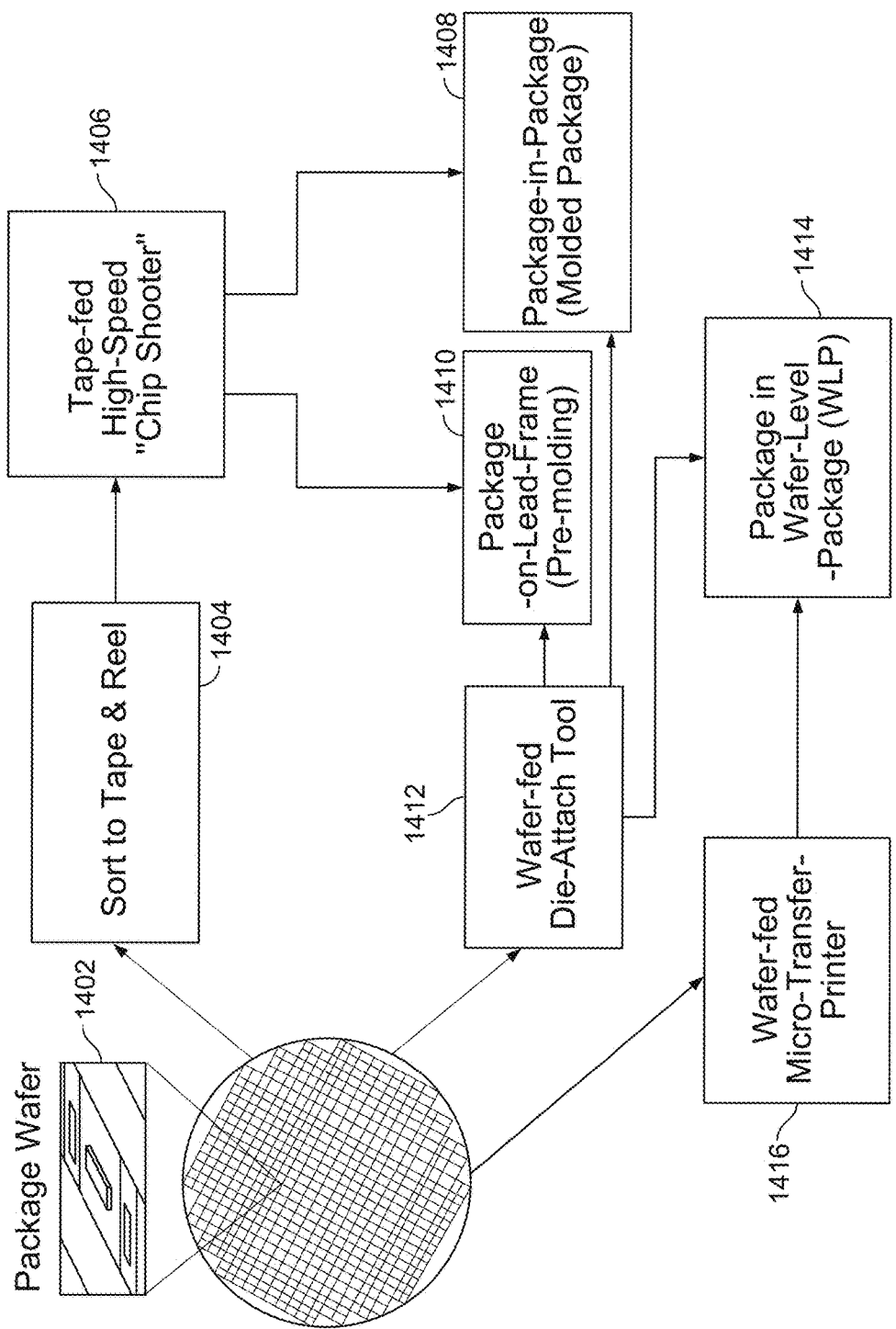
FIG. 14 is an illustration of example adaptable assembly routes with wafer-level (1 1 1) silicon enabled packages.

FIG. 14 is an illustration of example adaptable assembly processes with wafer-level (1 0 0) silicon-enabled packages. Micro-scale devices on a packaged wafer 1402 can be transfer printed to a tape-and-reel 1404. The tape-and-reel 1404 can be provided to a tape-fed high-speed chip shooter 1406 for assembly. The tape-fed high-speed chip shooter 1406 can package the micro-scale devices on the tape-and-reel 1404 as, for example, a package-in-package molded package 1408 or a package-on-lead-frame that is subsequently molded into a package 1410.

In some embodiments, the package wafer 1402 is provided to a wafer-fed die-attach tool 1412. The wafer-fed die-attach tool 1412 can package the micro-scale devices into wafer-level-packages 1402. The wafer-fed die-attach tool 1412 can package the micro-scale devices on package-on-lead frames that are subsequently molded into a package 1410. The wafer-fed die attach tool 1412 can package the micro-scale devices into package-in-package devices 1408 or into a wafer-level package (WLP) 1414.

In some embodiments, the package wafer is provided to a wafer-fed micro-transfer printer 1416 which packages the micro-scale devices in wafer-level-packages 1414.

Figure 15:
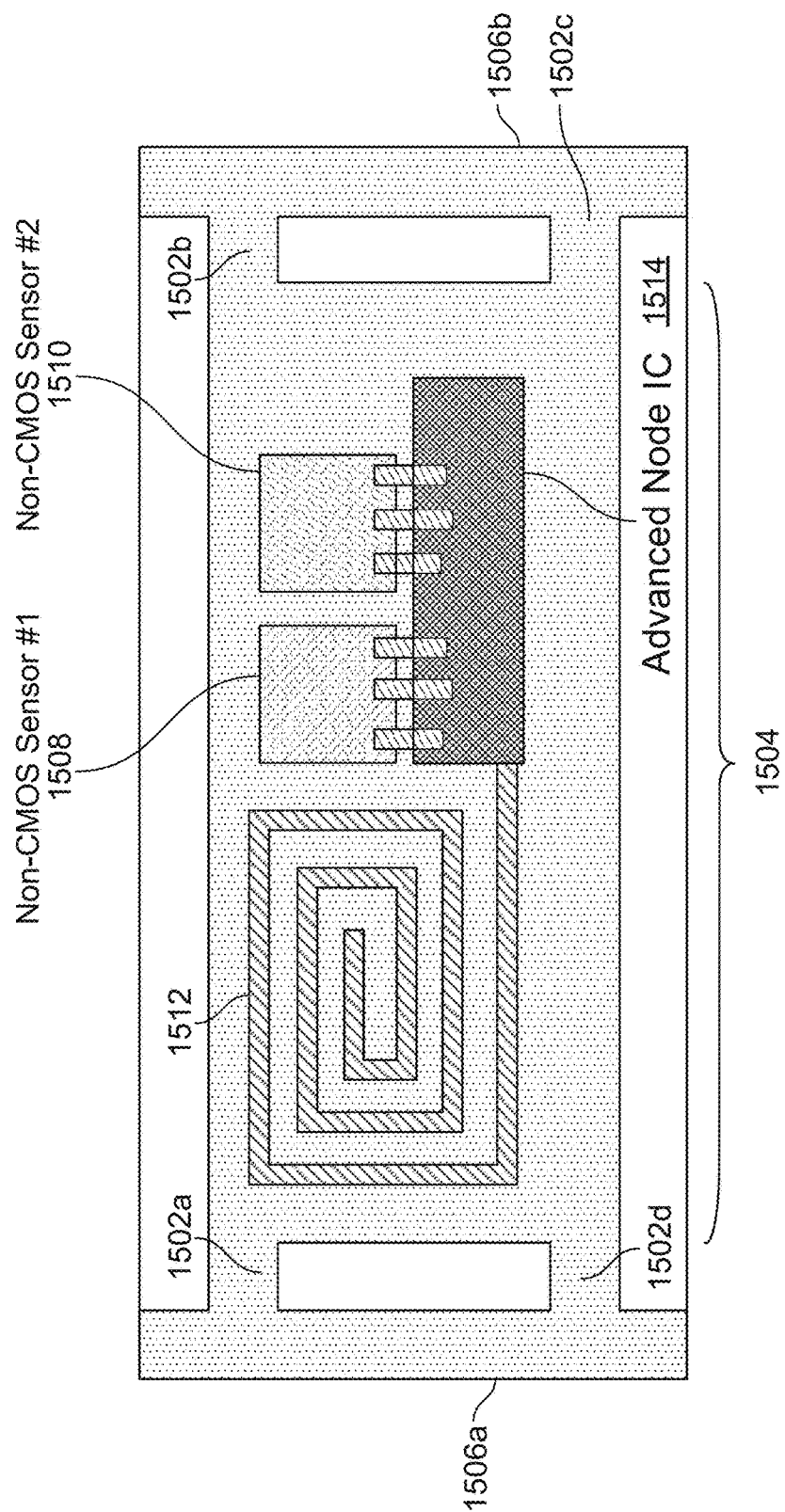
FIG. 15 is an illustration of an example system in a package using the (1 1 1) release system.

FIG. 15 is an illustration of an example system 1504 in a package using the (1 0 0) release system. The illustrated example device 150 can include a small integrated circuit 1514 that is interconnected with two different types of sensors 1508, 1510 and also interconnected with an antenna 1512 made using a common wafer-level metallization. This system can be entirely embedded in a dielectric material and can be released from the underlying (1 0 0) wafer as described above. The device 1504 can be coupled to anchors 1506a and 1506b by tethers 1502a-1502d. This provides a small package that can be assembled onto other substrates using, for example, micro-assembly techniques.

In another aspect of the disclosure, the anchor 110 and tether 108 are formed of a single polymer layer. The polymer layer further serves as protection for the fabricated micro-scale devices by encapsulating the micro-scale devices after they are fabricated on the native substrate and during the micro-printing process. To this end, the encapsulation serves to protect any chemical-sensitive layers within fabricated micro devices. The encapsulating polymer layer, for example, provides electrical insulation and protection from contaminants, moisture, and oxidizers. The encapsulating polymer layer further allows for electrically contactable structures to be employed on the bottom side, top side, or lateral side of a printable object.

The polymer layer, in some embodiments, can be made of a photoresist or photo-sensitive material with sufficient stiffness to maintain the spatial configurations of printable structures during a release process. The polymer that forms the anchor, tether, or encapsulation the micro-scale device can also be selectively removed from the printable objects and the target substrate after transfer by dissolution, etching or other processes. The polymer can have sufficient adhesion to serve as a contact interface with a transfer element of the micro-printing system so that it can be picked up from a native substrate and can be treated to serve as an interface for separation between the transfer element and the micro-scale devices once the micro-scale devices have been transferred to a destination substrate.

In some embodiments, the single polymer layer improves the density of the printable, micro devices for a given wafer. The supporting, non-printable structures (e.g., the anchor and tether) can be fabricated such that the distance between adjacent printable structures is miniaturized, for example less than 500 microns, less than 100 microns, less than 50 microns, less than 25 microns, or less than 10 microns.

Figure 16:
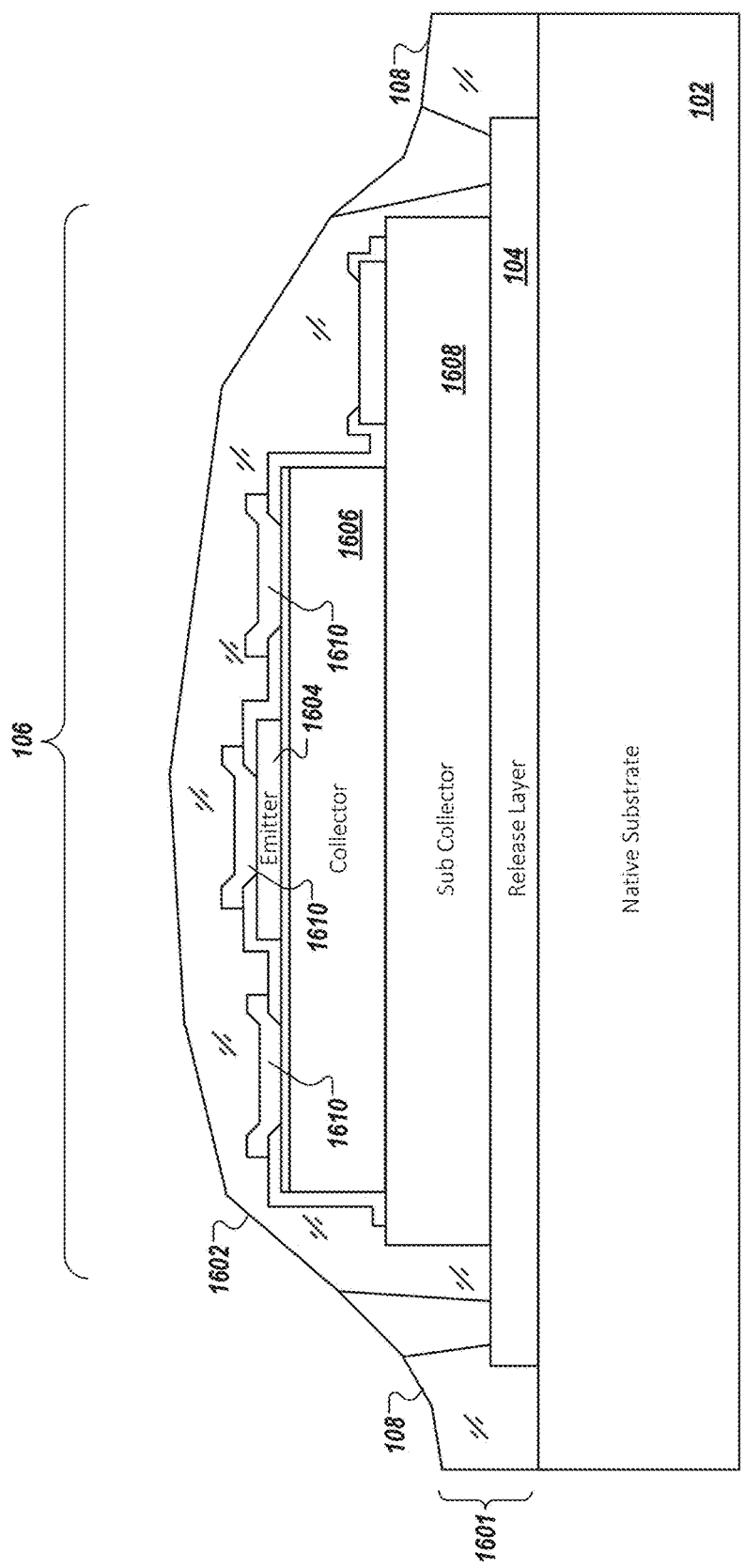
FIG. 16 is an illustration of an example showing a releasable micro object with anchors, tethers and encapsulation.

FIG. 16 illustrates an embodiment of a releasable micro object 106 comprising anchors 108, tethers (not shown) and encapsulating layer 1602 formed of a single polymer layer 1601. As shown in the figure, the releasable micro object 106 is a printable active component having an emitter 1604, a collector 1606, a sub-collector 1608, and electrical pads 1610. The releasable micro object 106 is fabricated over a sacrificial layer 104, referred to in the figure as a release layer.

The polymer layer 1601 is applied over the releasable micro object 106 and over the native source substrate 102. As shown, the polymer layer 1601 encapsulates the exposed top and side regions of the micro object 106. The polymer layer 1601 also encapsulates a portion of the sacrificial layer 104.

To separate the releasable micro objects 106 from the native substrate 102, the polymer layer 1601 is treated to form the anchor structure 108 on the source substrate 102 and the tether structure 110 (not shown). As illustrated in the figure, the anchor structures 108 are formed over the native substrate 102 (or a substantial portion thereof) to remain rigidly attached to the substrate 102 as the sacrificial material within the sacrificial layer 104 is fully or partially removed. The tether 110 (not shown) connects the anchor structure 108 to the printable micro object 106 and the encapsulating layer 1602 of the polymer layer 1601. The treatment, in some embodiments, also forms ports of ingress (not shown in FIG. 16) in the polymer layer 1601 that exposes a portion of the sacrificial layer 104. The ports of ingress 1612 (FIG. 17) allows access to the sacrificial layer 104 to, for example, perform the undercutting removal process (e.g., by chemical etching).

In some embodiments, the treatment includes forming a photo-sensitive layer (as the polymer layer) on the releasable micro objects 106, then selectively exposing portions of the photo-sensitive layer to an energized beam (e.g., electromagnetic-radiation beam or electron beam) to alter solubility of the photo-sensitive layer to a photoresist developer. The photo-sensitive layer (or the entire device) can be exposed to heat to solidify the photo-sensitive layer. Subsequently, the portions of the portions of the photo-sensitive layer (e.g., soluble or insoluble to the photoresist developer) are then removed to define breakable tethers.

Photodefinable materials (such as photoresists or cross-linkable resins) can be used for making anchoring, tethering, or encapsulating structures, offering ease of formation, and in many cases ease of removal by dissolution in wet chemicals, organic solvents, or aqueous mixtures, or by ashing in oxygen and/or fluorine compounds.

The undercutting removal process can employ chemical reactants to etch the sacrificial layer 104 (shown as the release layer in FIG. 16), gaining access through ports of ingress formed in the anchoring, tethering, and/or encapsulation structures. Etch reaction products can exit the space under the releasable micro objects through ports of egress. In some embodiments, the ports of egress are the same as the ports of ingress (e.g, 1612 in FIG. 17). When the release layer is fully or partially removed, the releasable micro object is said to be at least partially released and ready for removal by a transfer element. The transfer element contacts and adheres to the partially released object. In some embodiments, it is advantageous for the transfer element to be conformable to make intimate contact with at least a portion of the topography of the releasable object. For example, the transfer element can include a conformable material, such as PDMS.

Figure 17:
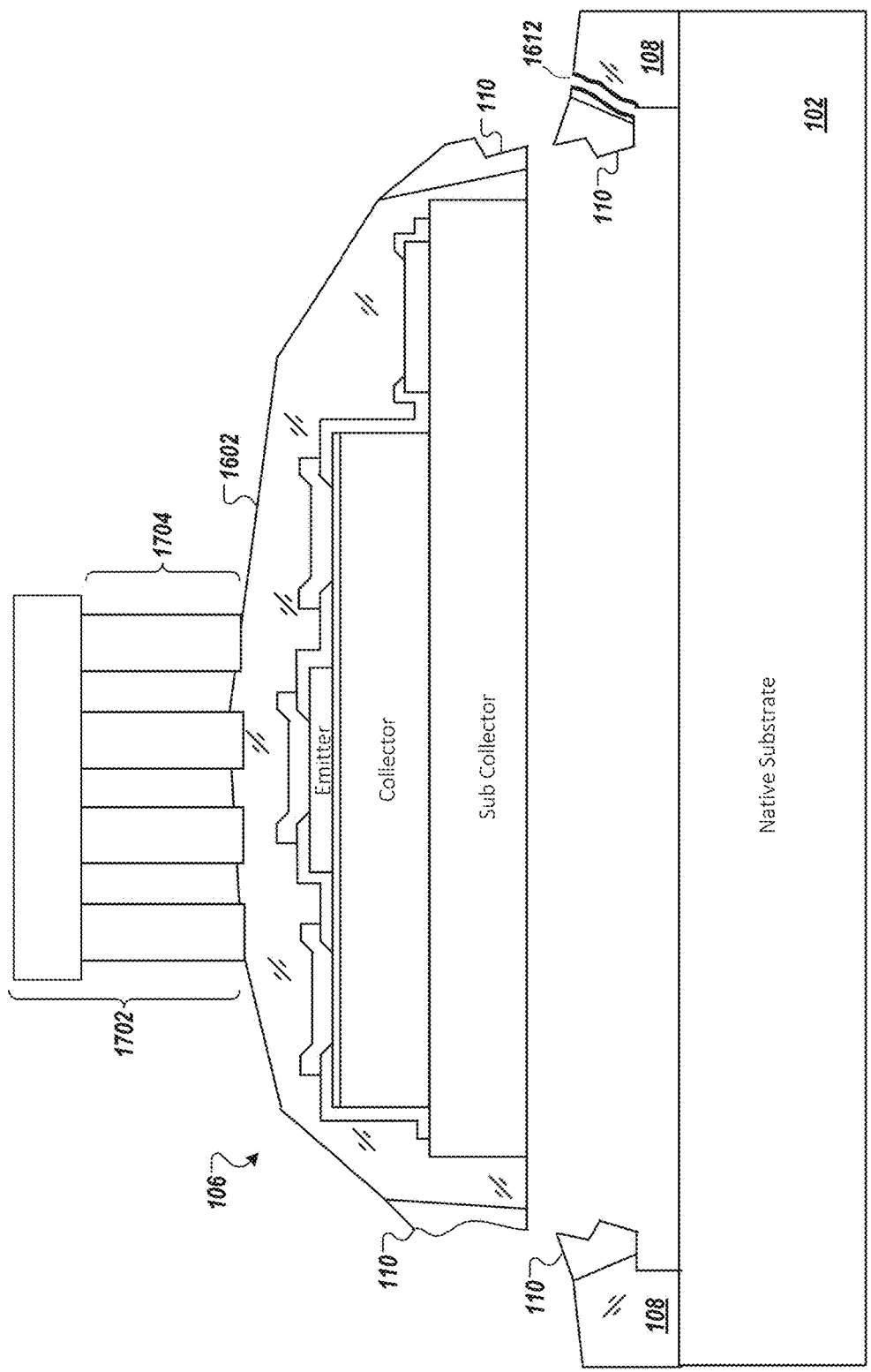
FIG. 17 is an illustration of release and removal showing an example releasable micro object.

FIG. 17 is an illustration of release and removal of example releasable micro objects 106. As shown, the releasable micro objects 106 are in contact with a transferring element 1702. In some embodiments multiple posts 1704 embodiments contact the releasable micro object 106. In other embodiments a single post contacts a releasable micro object 106. After adhering to the released object 106, the transferring element 1702 moves away from the native substrate 102 while maintaining adhesion to the released micro object 106, thereby retrieving, removing, separating, or picking the object 106 from its native substrate 102. In the process of removal, the anchor 108 or tether 110 structures fracture or otherwise lose connection to the native substrate 102 or the released object 106. In some embodiments, the tether 110 fractures upon contact by the transferring element 1702. In certain embodiments, the tether 110 fractures when the transferring element 1702 pulls the micro object 106 from the native substrate 102.

Materials selected for specific fracture properties, adhesion properties, or definition of geometries with stress concentration features in the anchoring and tethering structures are beneficial for controlling the points of separation or fracture. In some embodiments, the tether 110 is formed of a narrow structure (or shaped with a notch in certain embodiments) to provide a point of fracture and allow the printable micro object 106 to separate from the native structure 102. As noted above, tethers 110 can be made of organic materials, such as polymers, or inorganic materials such as silicon, silicon dioxide, or silicon nitride.

Referring still to FIG. 17, the polymer layer 1601, in particular, the encapsulation region 1602, serves as the point of contact with the transferring element 1702. In other embodiments, the transferring element 1702 contacts the micro object 106 itself.

Figure 19:
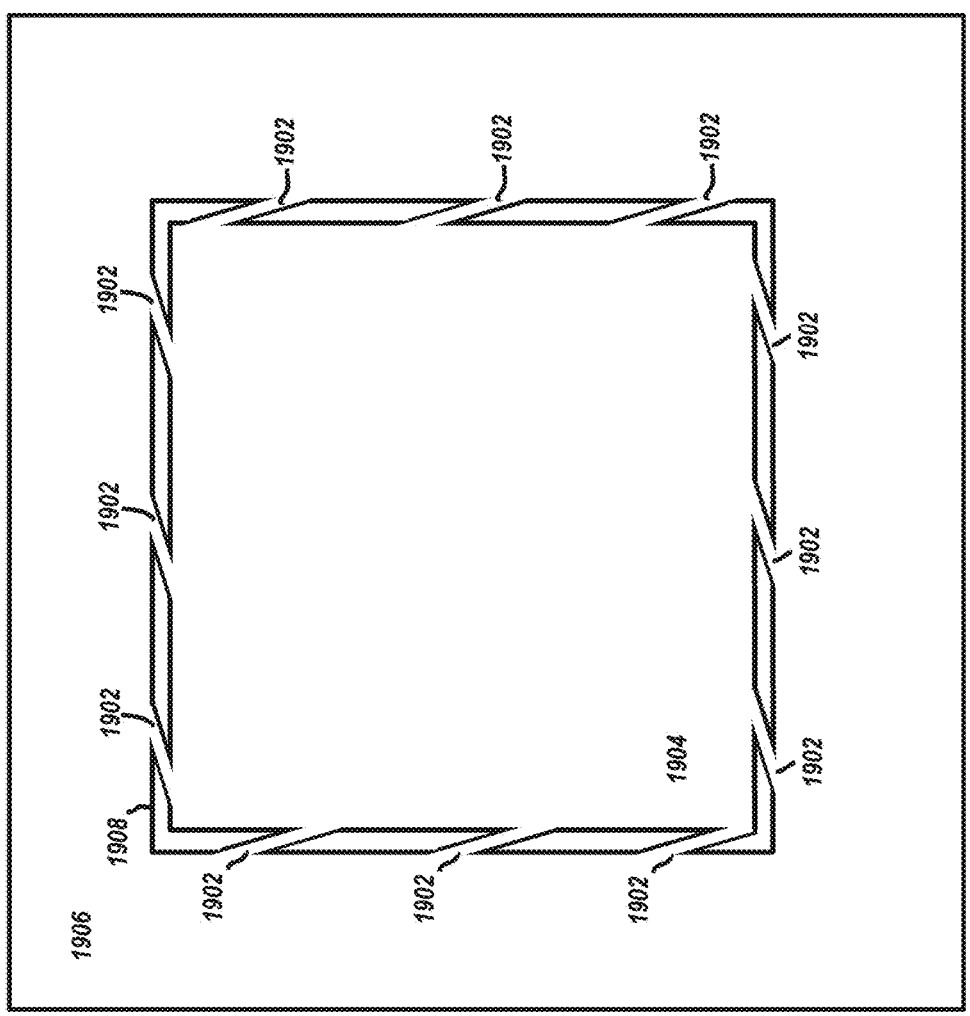

As illustrated in FIG. 19, in one embodiment, a tether design includes tethers 1902 that are oriented in such a way that the slow-etching planes are not allowed to arrest the lateral undercut. The tethers 1902 separate the trenches 1908 and connected to the chipset 1904 and anchors 1906. A key parameter, as illustrated in FIG. 20 is to ensure that d>0 so that the tether 1902 is angled. Such a design is useful, for example with InAlP release layers.

In some embodiments, the transferring element 1702 includes one or more posts, for example, organized in an array, to make contact with a given printable micro object 106. In certain embodiments, the transferring element 1702 forms a single surface to make contact with the polymer layer 1601.

In view of the structure, functions and apparatus of the systems and methods described here, in some embodiments, a system and method for providing micro-scale devices are provided. Having described certain embodiments of methods and apparatus for providing micro-scale devices, it will now become apparent to one of skill in the art that other embodiments incorporating the concepts of the disclosure can be used. Therefore, the disclosure should not be limited to certain embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions can be conducted simultaneously.

What is claimed:

1. An array of micro devices, the array comprising:
    a source substrate comprising silicon (1 0 0) having a process side;
    a sacrificial layer comprising silicon (1 0 0) sacrificial material having an anisotropic crystal structure on the process side of the source substrate;
    a plurality of releasable micro objects formed at least in part on the sacrificial layer;
    a plurality of anchor structures located on the process side of the source substrate, wherein the anchor structures remain rigidly attached to the source substrate in the absence of the sacrificial material; and a plurality of tethers, wherein each tether of the plurality of tethers laterally connects a releasable micro object of the plurality of releasable micro objects to a portion of one of the anchor structures, each releasable micro object is connected to an anchor by a single tether, and the tethers are shaped to fracture in response to pressure.

2. The array of claim 1, wherein each of the plurality of tethers is sized and shaped to break when a corresponding micro object is contacted by an elastomer stamp for micro transfer printing from the source substrate to a target substrate, different from the source substrate.

3. The array of claim 1, wherein the sacrificial material is a portion of the source substrate.

4. The array of claim 1, wherein the anchor structure forms a continuous structure, spanning more than one releasable micro object of the plurality of releasable micro objects in at least one dimension.

5. The array of claim 1, wherein each of the plurality of anchors are characterized by locally concave or internal corners and each of the plurality of releasable micro objects is locally characterized by convex or external corners.

6. The array of claim 1, wherein each of the tethers comprises one or more notches that provide a point of fracture when a respective releasable micro object is moved with respect to the anchor structures.

7. The array of claim 1, wherein the portion of the tether in contact with the anchor does not overlap the portion of the tether in contact with the releasable micro object in a direction parallel to the edge of the releasable micro object or the anchor to which the tether is attached.

8. The array of claim 1, wherein the tether has opposing sides that are not attached to the anchor or the releasable micro object, wherein the opposing sides overlap in at least one of the x-direction and the y-direction.

9. The array of claim 1, wherein the releasable micro object is separated from the anchor in the x-direction by a separation distance x, the tether is attached to the anchor or the releasable micro object at an acute angle theta, and the distance between the first edge and second edges at which the tether is attached to the anchor or releasable micro object is y, and y is less than or equal to x*tan(theta).

10. The array of claim 1, wherein:
a first pair of first and second tethers are offset the y-direction and do not overlap in the offset direction and a second pair of first and second tethers are offset in the x-direction perpendicular to the edge of the anchor or releasable micro object and do not overlap in the offset direction; or
a pair of first and second tethers are offset in the y-direction and do not overlap in the offset direction and are offset in the x-direction and do not overlap in the offset direction.

11. An array of micro devices, the array comprising:
a source substrate having a process side;
a sacrificial layer comprising silicon (1 0 0) sacrificial material on the process side of the source substrate;
a plurality of releasable micro objects formed at least in part on the sacrificial layer;
a plurality of anchor structures located on the process side of the source substrate, wherein the anchor structures remain rigidly attached to the source substrate in the absence of the sacrificial material; and
a plurality of tethers, wherein each tether of the plurality of tethers laterally connects a releasable micro object of the plurality of releasable micro objects to a portion of one of the anchor structures, the tethers are shaped to fracture in response to pressure, and each tether of the plurality of tethers is located on an off-center, anchor-facing edge of the respective releasable micro object of the plurality of releasable micro objects, so that in the absence of the sacrificial material the releasable micro objects are capable of moving with respect to the anchor structures and the tethers deform when mechanically stressed.

12. The array of claim 11, wherein the sacrificial material is a portion of the source substrate.

13. The array of claim 11, wherein it is not possible to draw a rectangle covered by the anchors, tethers, and micro object with an edge parallel to the <0 1 1> directions that has an edge passing through the micro object.

14. The array of claim 11, wherein any rectangle covered by the anchors, tethers, and printable structure with edges parallel to the <0 1 1> directions does not have an edge passing through the releasable micro object.

15. The array of claim 11, wherein it is not possible to draw a rectangle covered by the anchors, tethers, and printable micro object with edges parallel to the <0 1 1> directions that has an edge passing through releasable micro object.

16. The array of claim 11, wherein the tether is disconnected from the substrate surface in the area of a convex hull drawn around the exposed surface of the sacrificial layer.

* * * * *

UNITED STATES PATENT AND TRADEMARK OFFICE
CERTIFICATE OF CORRECTION

PATENT NO. : 9,929,053 B2
APPLICATION NO. : 14/947596
DATED : March 27, 2018
INVENTOR(S) : Christopher Bower et al.

Page 1 of 1

It is certified that error appears in the above-identified patent and that said Letters Patent is hereby corrected as shown below:

In the Claims

Column 31, Lines 44 and 45 (Claim 10) please replace:
"a first pair of first and second tethers are offset the y-direction"
With:
--a first pair of first and second tethers are offset in the y-direction--

Signed and Sealed this
Eighteenth Day of September, 2018

Andrei Iancu
*Director of the United States Patent and Trademark Office*